United States Patent
Hsieh et al.

(10) Patent No.: US 12,507,461 B2
(45) Date of Patent: Dec. 23, 2025

(54) SEMICONDUCTOR DEVICE

(71) Applicant: TAIWAN SEMICONDUCTOR MANUFACTURING CO., LTD., Hsinchu (TW)

(72) Inventors: Bo-Wen Hsieh, Miaoli County (TW); Wen-Hsin Chan, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 42 days.

(21) Appl. No.: 18/504,473

(22) Filed: Nov. 8, 2023

(65) Prior Publication Data

US 2024/0072144 A1 Feb. 29, 2024

Related U.S. Application Data

(60) Continuation of application No. 17/327,111, filed on May 21, 2021, now Pat. No. 11,848,367, which is a division of application No. 16/045,796, filed on Jul. 26, 2018, now Pat. No. 11,018,234.

(51) Int. Cl.
*H10D 84/01* (2025.01)
*H10D 62/10* (2025.01)
*H10D 64/27* (2025.01)
*H10D 84/03* (2025.01)
*H10D 84/83* (2025.01)

(52) U.S. Cl.
CPC ......... *H10D 64/517* (2025.01); *H10D 62/115* (2025.01); *H10D 84/0158* (2025.01); *H10D 84/038* (2025.01); *H10D 84/834* (2025.01)

(58) Field of Classification Search
CPC .......... H01L 27/0886; H01L 29/66795; H01L 29/785; H10D 84/0158; H10D 84/834
See application file for complete search history.

(56) References Cited

U.S. PATENT DOCUMENTS

| | | |
|---|---|---|
| 10,297,668 B1 | 5/2019 | Lee et al. |
| 2007/0184627 A1 | 8/2007 | Cho et al. |
| 2009/0170267 A1 | 7/2009 | Shah et al. |
| 2017/0103985 A1 | 4/2017 | Kim et al. |
| 2018/0033790 A1 | 2/2018 | Li et al. |

(Continued)

*Primary Examiner* — Michele Fan
(74) *Attorney, Agent, or Firm* — Birch, Stewart, Kolasch & Birch, LLP

(57) ABSTRACT

A semiconductor device includes a semiconductor substrate, a first semiconductor fin, a second semiconductor fin, an isolation structure, and a gate structure. The first and second semiconductor fins extend upwards from a top surface of the semiconductor substrate. The isolation structure is between the first semiconductor fin and the second semiconductor fin. The gate structure includes a first work function layer, a second work function layer, and a third work function layer. The first work function layer surrounds the first semiconductor fin and the second semiconductor fin. The second work function layer surrounds the first semiconductor fin and is over the first work function layer. The third work function layer surrounds the first semiconductor fin and is over the second work function layer and the isolation structure. The first work function layer is in contact with the second work function layer and the third work function layer.

20 Claims, 33 Drawing Sheets

(56) References Cited

U.S. PATENT DOCUMENTS

| | | |
|---|---|---|
| 2018/0040620 A1 | 2/2018 | Ha et al. |
| 2018/0138178 A1 | 5/2018 | Lin et al. |
| 2018/0151575 A1* | 5/2018 | Li .................... H01L 29/66545 |
| 2018/0261514 A1 | 9/2018 | Xie et al. |
| 2018/0366582 A1 | 12/2018 | Kim et al. |
| 2019/0013314 A1 | 1/2019 | Choi et al. |
| 2019/0097054 A1 | 3/2019 | Kim et al. |
| 2019/0131417 A1 | 5/2019 | Hong et al. |
| 2019/0229200 A1 | 7/2019 | Lee et al. |
| 2019/0259765 A1 | 8/2019 | Liaw |
| 2019/0371679 A1 | 12/2019 | Wang |

* cited by examiner

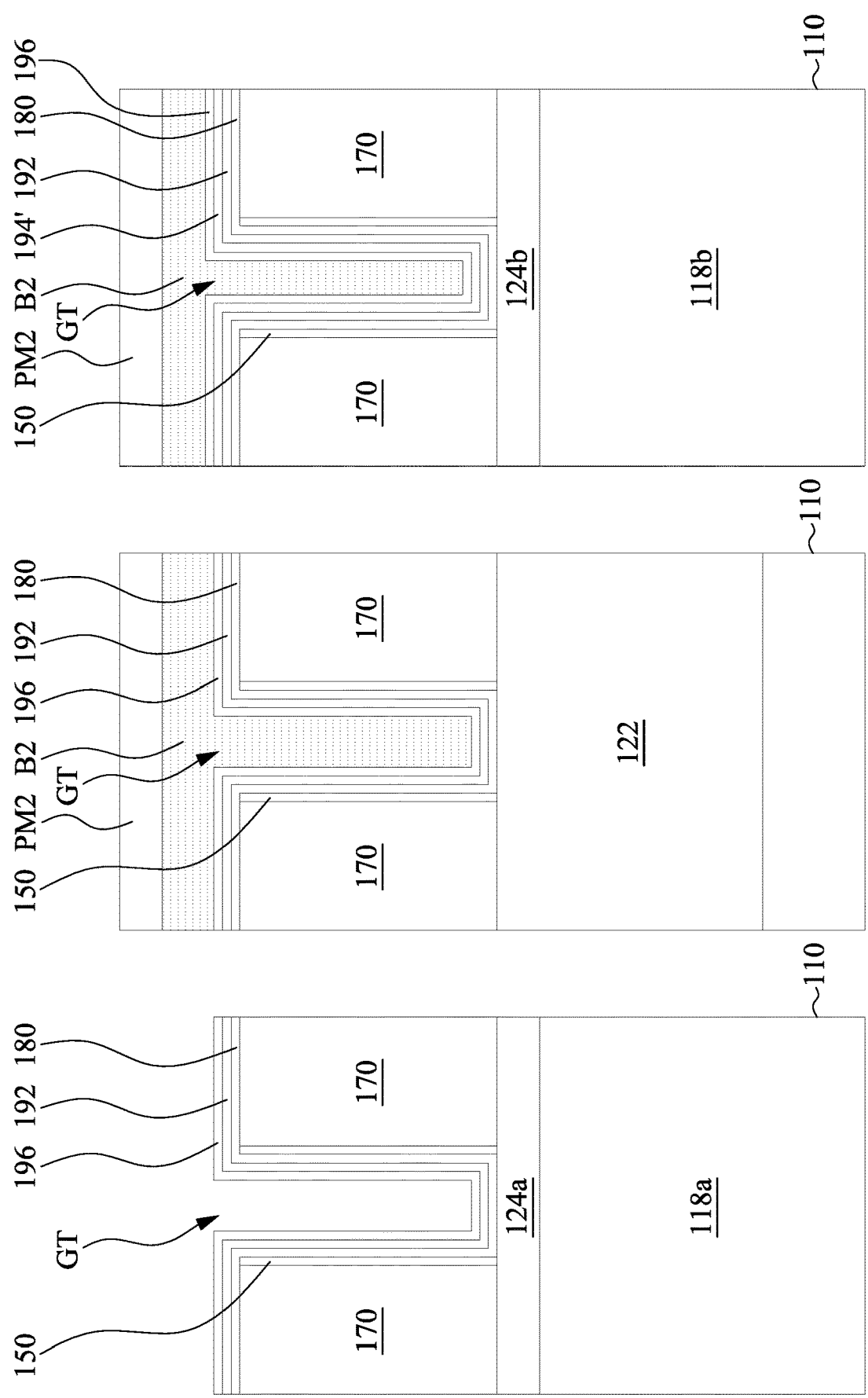

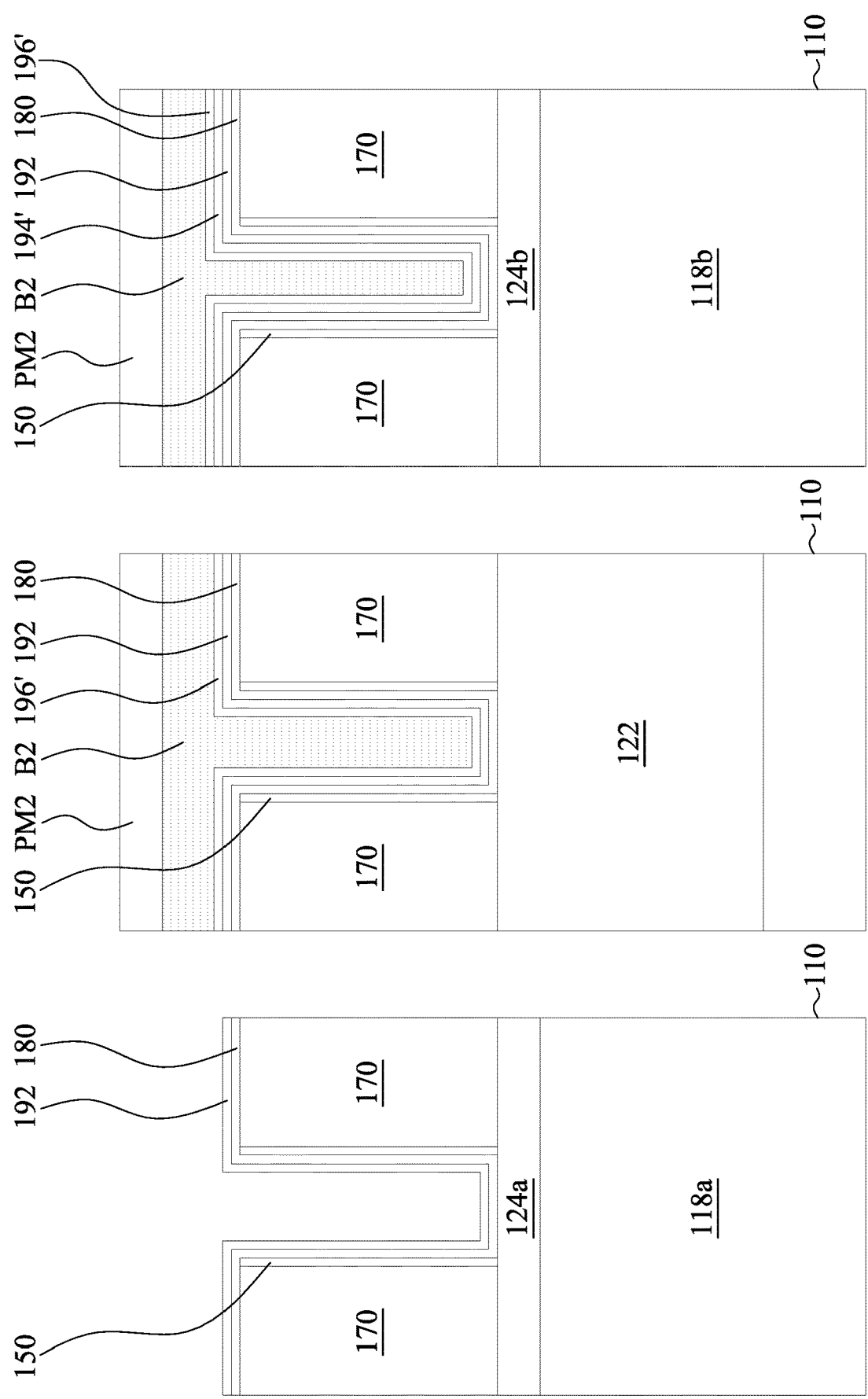

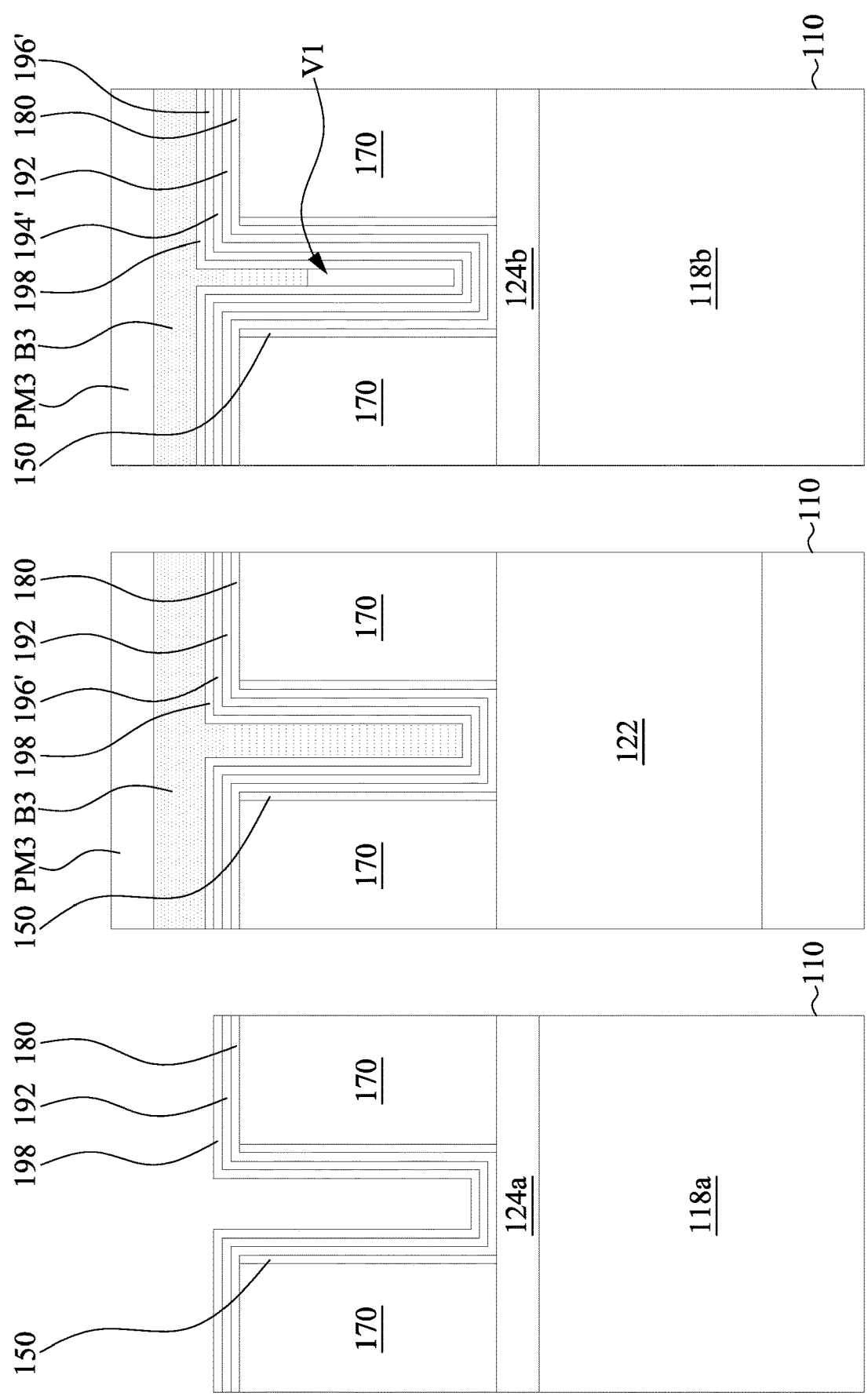

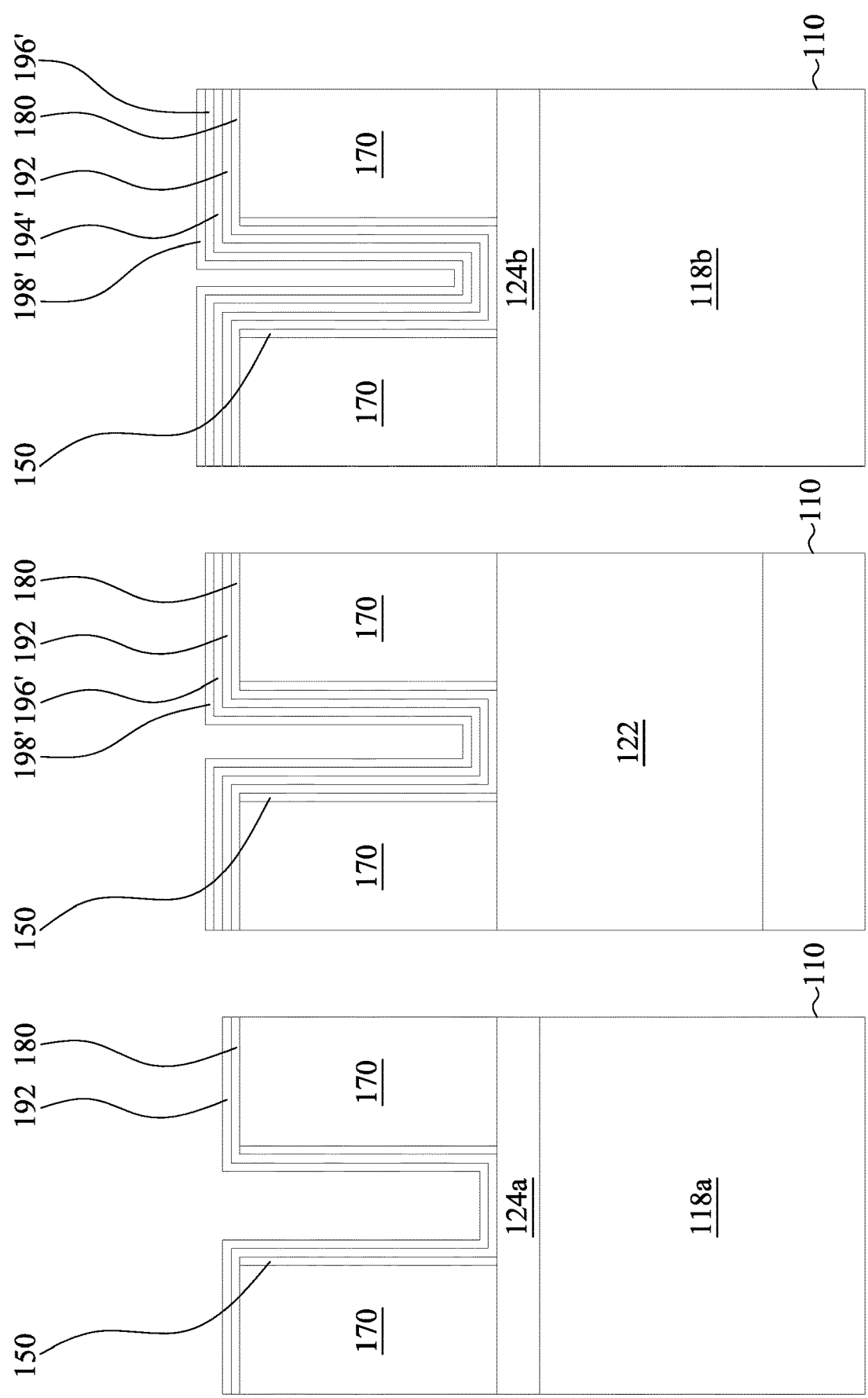

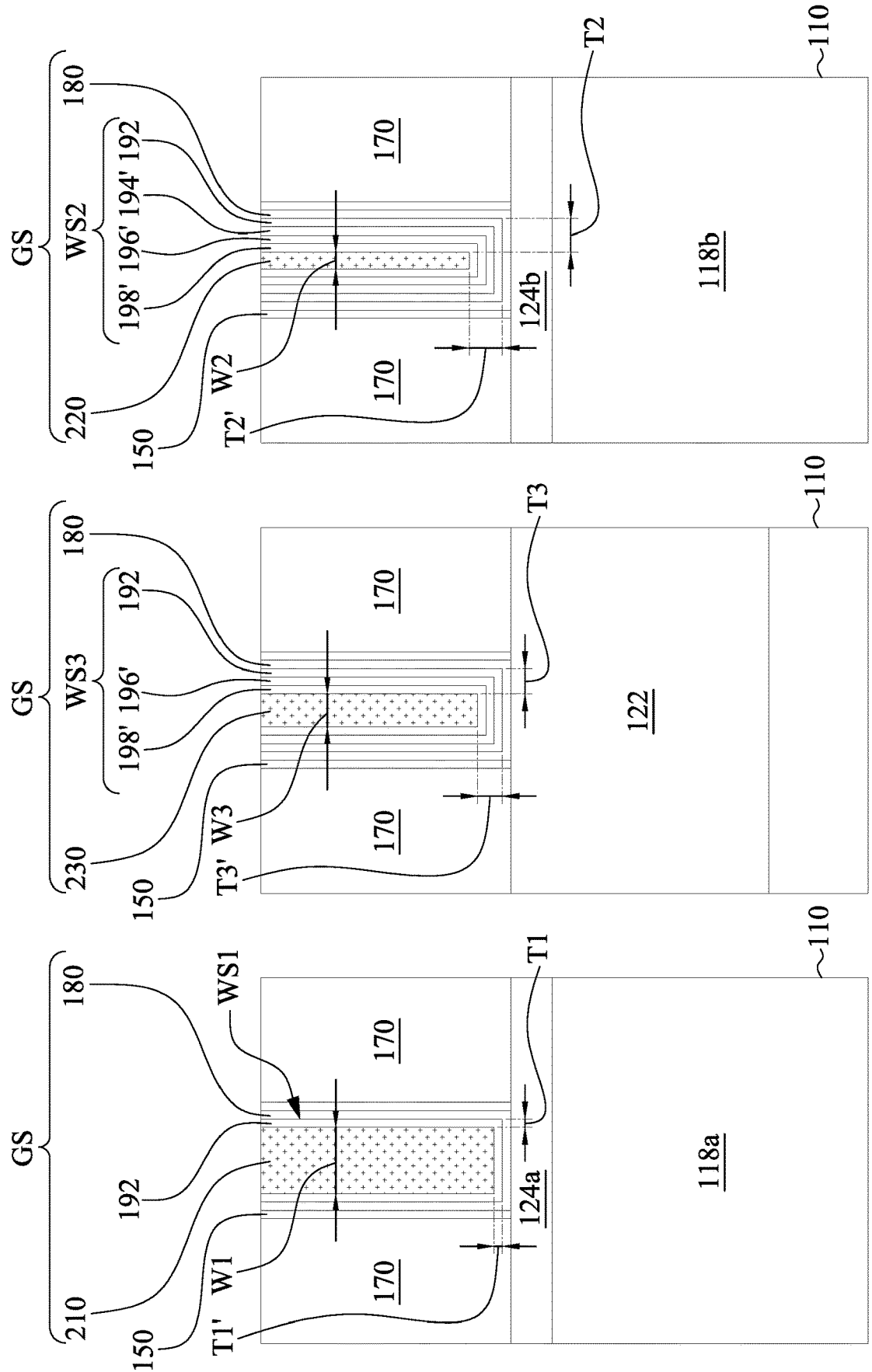

SEMICONDUCTOR DEVICE

PRIORITY CLAIM AND CROSS-REFERENCE

The present application is a continuation application of the application Ser. No. 17/327,111, filed on May 21, 2021, which is a divisional application of U.S. patent application Ser. No. 16/045,796, filed Jul. 26, 2018, now U.S. Pat. No. 11,018,234, issued May 25, 2021, the entirety of which is incorporated by reference herein in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
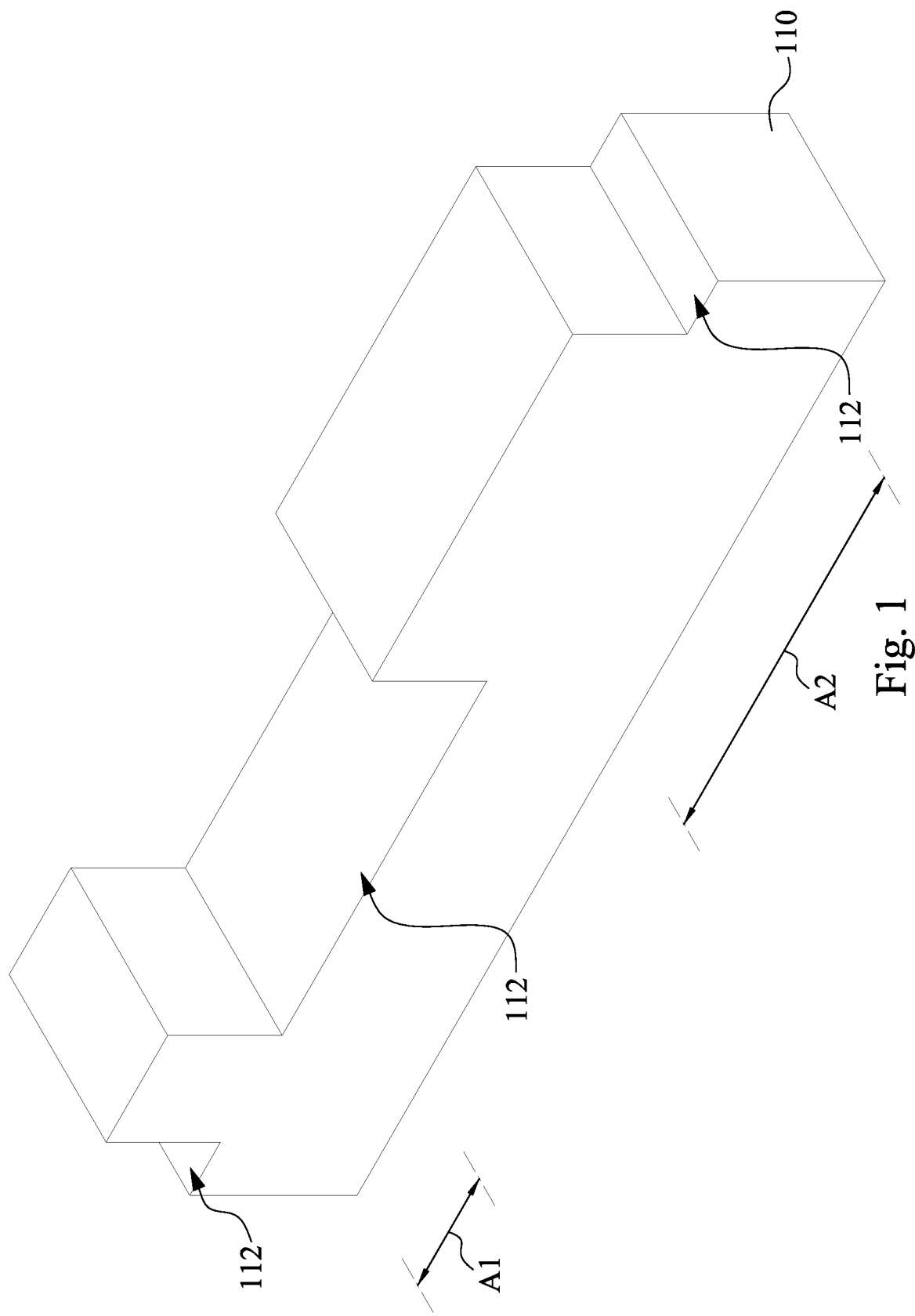
FIGS. 1-16F illustrate a semiconductor device of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable semiconductor device. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-16D illustrate a semiconductor device of manufacturing a semiconductor device at various stages in accordance with some embodiments.

Reference is made to FIG. 1. A substrate 110 is provided. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable semiconductor devices.

Trenches 112 are formed in the substrate 110 for defining a first area A1 and a second area A2 of the substrate 110. The trenches 112 may be formed using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the substrate 110. The exposed portions of the substrate 110 may be removed through a suitable process such as reactive ion etching (RIE) in order to form the trenches 112 in the substrate 110, although other suitable processes may alternatively be used. In some embodiments, the trenches 112 may be formed to have a depth less than about 500 nm from the surface of the substrate 110, such as about 250 nm. As explained below with respect to FIG. 2, the first area A1 and second area A2 of the substrate 110 between the trenches 112 is subsequently patterned to form individual fins.

As one of skill in the art will recognize, however, the processes and materials described above to form the masking layer are not the only semiconductor device that may be used to protect portions of the substrate 110 while exposing other portions of the substrate 110 for the formation of the trenches 112'. Other suitable process, such as a patterned and developed photoresist, may alternatively be utilized to expose portions of the substrate 110 to be removed to form the trenches 112'. All such semiconductor devices are fully intended to be included in the scope of the present disclosure.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may further include various active regions, such as regions configured for an N-type metal-oxide-semiconductor transistor device and regions configured for a P-type metal-oxide-semiconductor transistor device.

Figure 2:
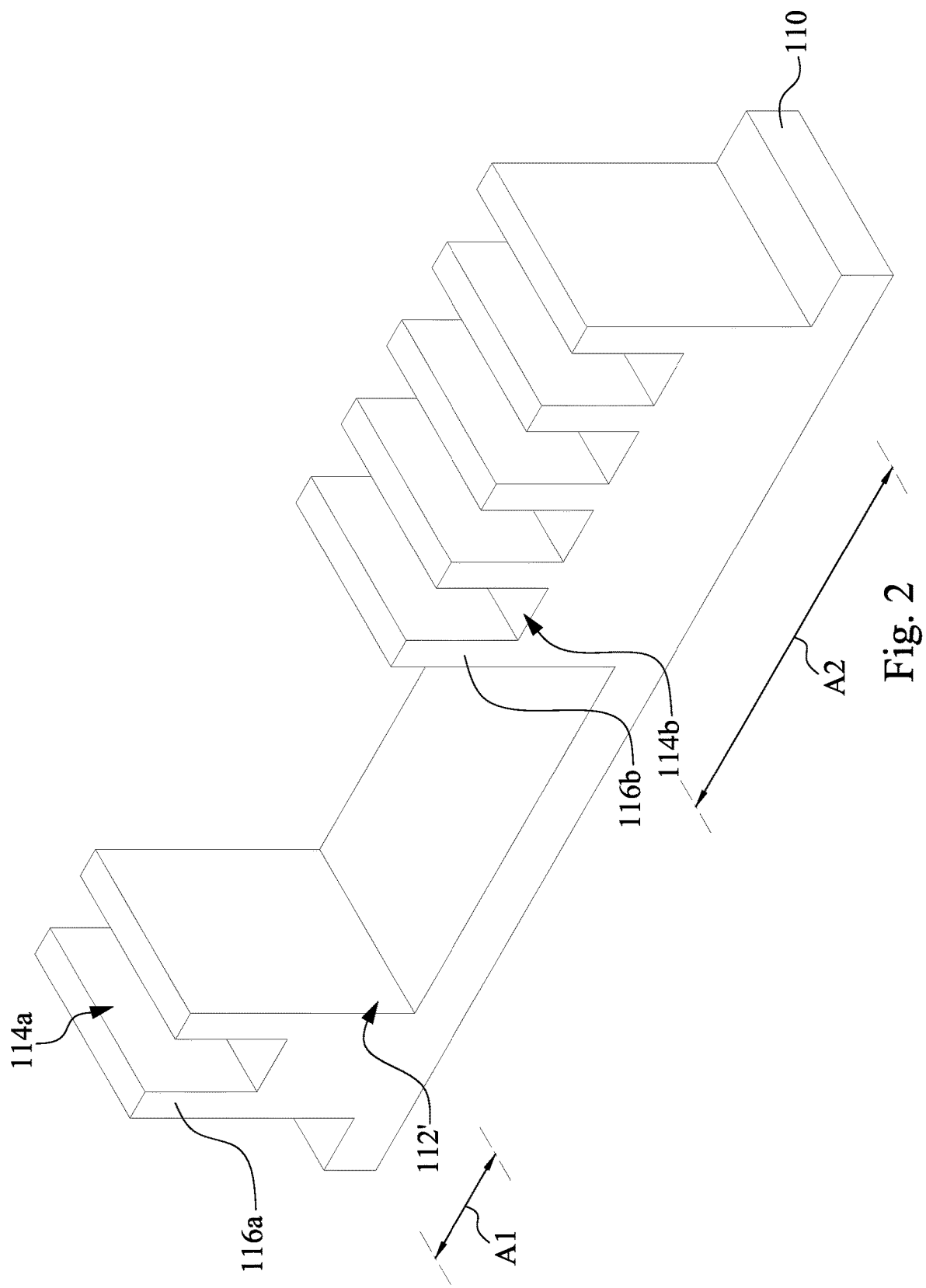

Reference is made to FIG. 2. At least one trench 114a is formed in the first area A1 of the substrate 110, trenches 114b are formed in the second area A2 of the substrate 110, and the trenches 112 are formed to be trenches 112'. In some embodiments, the trenches 114a can be isolation regions between separate semiconductor fins 116a that share either a similar gate or similar sources or drains, and the trenches 114b can be isolation regions between separate semiconductor fins 116b that share either a similar gate or similar sources or drains. The trenches 112 may be isolation regions located between fins that do not share a similar gate, source, or drain.

The trenches 114a and 114b may be formed using a similar process as the trenches 112 (discussed above with respect to FIG. 1) such as a suitable masking or photolithography process followed by an etching process. Additionally, during the formation of the trenches 114a and 114b, the trenches 112 of FIG. 1 may be deepened, such that the trenches 112' extend into the substrate 110 a further distance than the trenches 114a and 114b. That is, the trenches 112' are deeper than the trenches 114a and 114b, and a bottom surface of the trench 112' is lower than a bottom surface of the trenches 114a and 114b. This may be done by using a suitable mask to expose both the trenches 112 as well as those areas of the substrate 110 that will be removed to form the trenches 114a and 114b. As such, the trenches 112' may have a depth between about 20 nm and about 700 nm, such as about 320 nm, and the trenches 114a and 114b may have a third depth between about 10 nm and about 150 nm, such as about 100 nm. It is noted that although in FIG. 2 the trenches 112', 114a, and 114b have sharp corners, in some other embodiments, the trenches 112', 114a, and 114b may have round corners depending on the etching conditions.

However, as one of ordinary skill in the art will recognize, the process described above to form the trenches 112', 114a, and 114b is one potential process, and is not meant to be limited with this respect. Rather, other suitable process through which the trenches 112', 114a, and 114b may be formed such that the trenches 112' extend into the substrate 110 further than the trench 114a and 114b may be utilized. For example, the trenches 112' may be formed in a single etch step and then protected during the formation of the trenches 114a and 114b. Other suitable process, including any number of masking and removal processes may alternatively be used.

In addition to forming the trenches 114a and 114b, the masking and etching process additionally forms the semiconductor fins 116a and 116b from those portions of the substrate 110 that remain unremoved. These semiconductor fins 116a and 116b may be used, as discussed below, to form the channel region of the semiconductor device.

Figure 3:
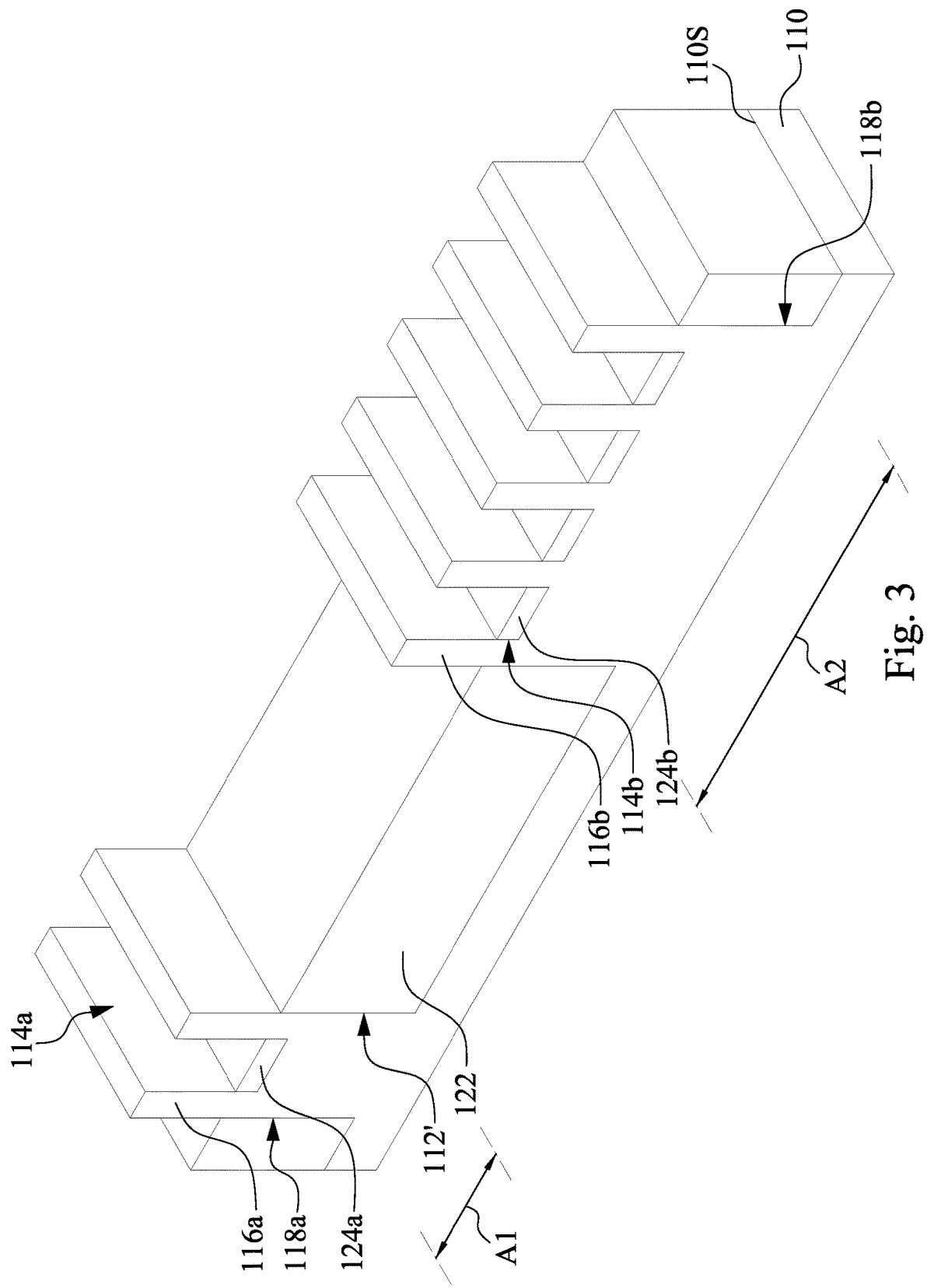

Reference is made to FIG. 3. The trenches 112', 114a, and 114b are filled with a dielectric material (not shown), and then the dielectric material is recessed to respectively form inter-device isolation structures 122 in the trenches 112' and intra-device isolation structures 124a and 124b in the trenches 114a and 114b. In some embodiments, the inter-device isolation structures 122 extend into the substrate 110 further than the intra-device isolation structure 124a and the 124b. In other words, a bottom surface of the inter-device isolation structures 122 is lower than a bottom surface of the intra-device isolation structure 124a and 124b. The inter-device isolation structures 122 define a crown base structure 118a in a first area A1 of the substrate 110 and a crown base structure 118b in a second area A2 of the substrate 110 respectively. The crown base structure 118a and 118b protrude outward from a surface 110S of the semiconductor substrate 110 as plateaus. In some embodiments, the inter-device isolation structure 122 extends from a side of the semiconductor fin 116a to a side of the semiconductor fin 116b next to the semiconductor fin 116a. The intra-device isolation structure 124a defines a plurality of the semiconductor fins 116a on the crown base structure 118a, and the intra-device isolation structures 124b define a plurality of the semiconductor fins 116b on the crown base structure 118b. The dielectric material may be an oxide material, a high-density plasma (HDP) oxide, or the like. The dielectric material may be formed, after an optional cleaning and lining of the trenches 112', 114a and 114b, using a CVD semiconductor device (e.g., the high aspect ratio process (HARP) process), a high density plasma CVD semiconductor device, or other suitable semiconductor device of formation as is known in the art.

Figure 4:
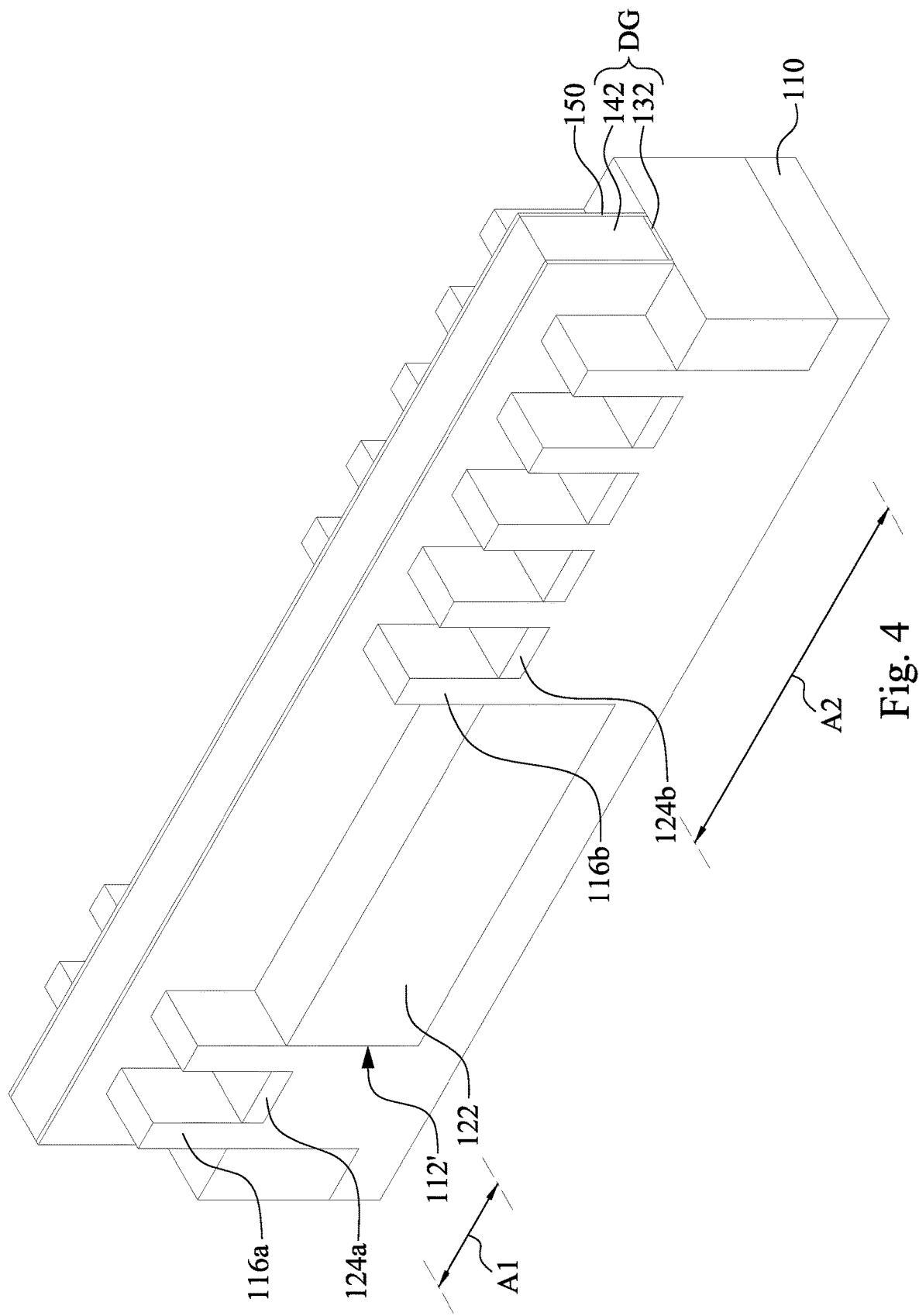

Reference is made to FIG. 4. At least one dummy gate structure DG is formed around the semiconductor fins 116a and 116b of the substrate 110. In some embodiments, the dummy gate structure DG includes a dummy gate 142 and a gate dielectric 132 underlying the dummy gate 142. The dummy gate 142 may include polycrystalline-silicon (poly-Si) or poly-crystalline silicon-germanium (poly-SiGe). Further, the dummy gate 141 may be doped poly-silicon with uniform or non-uniform doping. The gate dielectric 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate structure DG may be formed by, for example, forming a stack of a gate dielectric layer and a dummy gate material layer over the substrate 110. A patterned mask is formed over the stack of gate dielectric layer and dummy gate material layer. Then, the gate dielectric layer and the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the semiconductor fins 116a and 116b are exposed.

In some embodiments, gate spacers 150 are formed on opposite sidewalls of the dummy gate structure DG. In some embodiments, the gate spacers 150 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 150 may include a single layer or multilayer structure made of different dielectric materials. The semiconductor device of forming the gate spacers 150 includes blanket forming a dielectric layer using, for example, CVD, PVD or ALD, and then performing an etching process such as anisotropic etching to remove horizontal portions of the dielectric layer. The remaining portions of the dielectric layer on sidewalls of the dummy gate structure DG can serve as the gate spacers 150. In some embodiments, the gate spacers 150 may be used to offset subsequently formed doped regions, such as source/drain regions. The gate spacers 150 may further be used for designing or modifying the source/drain region profile.

Figure 5:
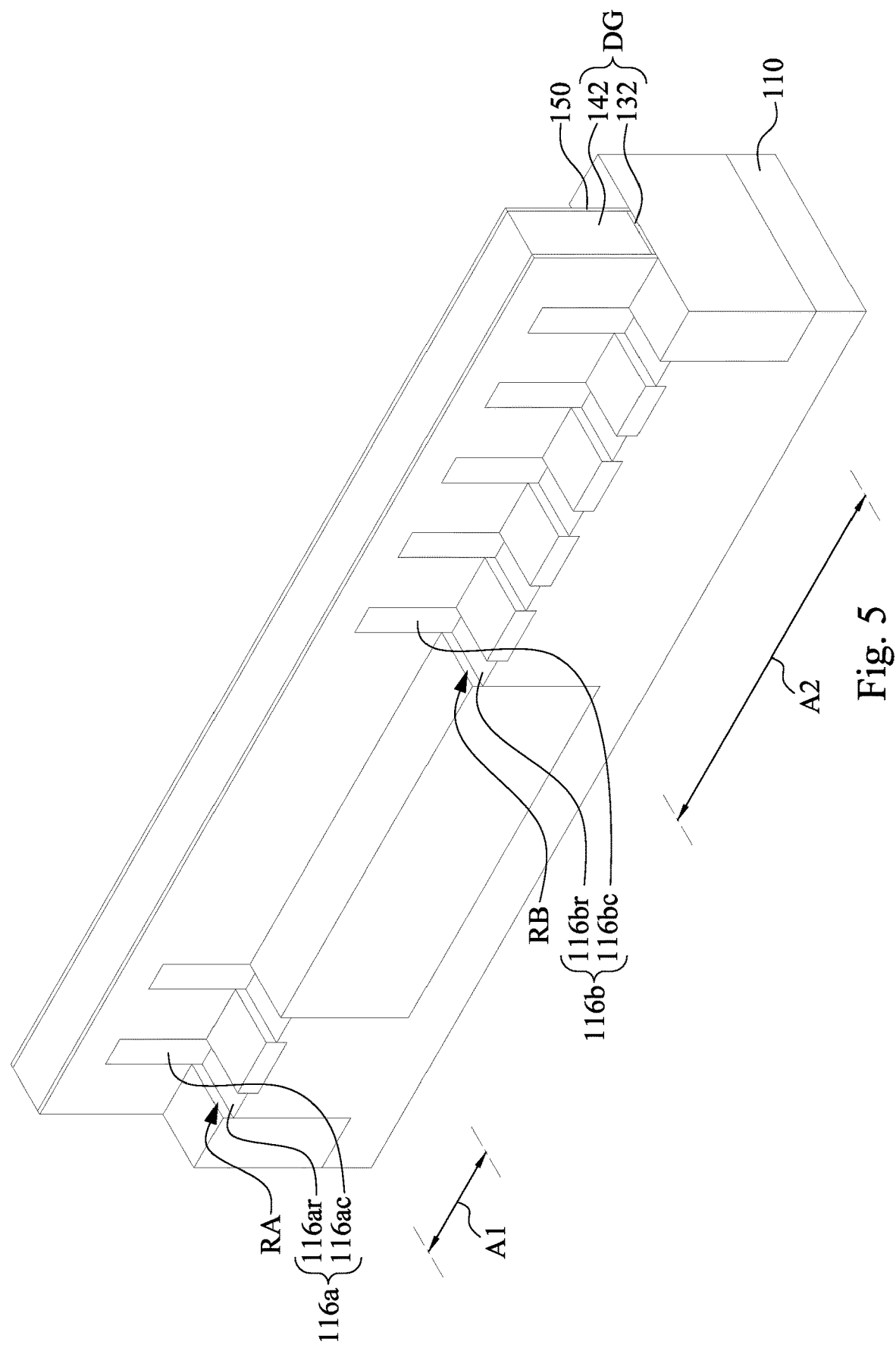

Reference is made to FIG. 5. Portions of the semiconductor fins 116a and 116b uncovered by the dummy gate structure DG are removed, such that each of the remaining semiconductor fins 116a include a recessed portion 116ar uncovered by the dummy gate structure DG and a channel portion 116ac covered by the dummy gate structure DG, respectively, and each of the remaining semiconductor fins 116b include a recessed portion 116br uncovered by the dummy gate structure DG and a channel portion 118bc covered by the dummy gate structure DG, respectively. Herein, a plurality of recesses RA and RB are formed in the semiconductor fins 116a and 116b of the substrate 110, respectively.

The removal of the semiconductor fins 116a and 116b may include a dry etching process, a wet etching process, or combination of dry and wet etching processes. The recessing process may also include a selective wet etch or a selective dry etch. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching). In some embodiments, the substantially diamond-shaped recesses RA and RB can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. After the etching process, a pre-cleaning process may be performed to clean the recesses RA and RB with hydrofluoric acid (HF) or other suitable solution in some embodiments.

Figure 6:
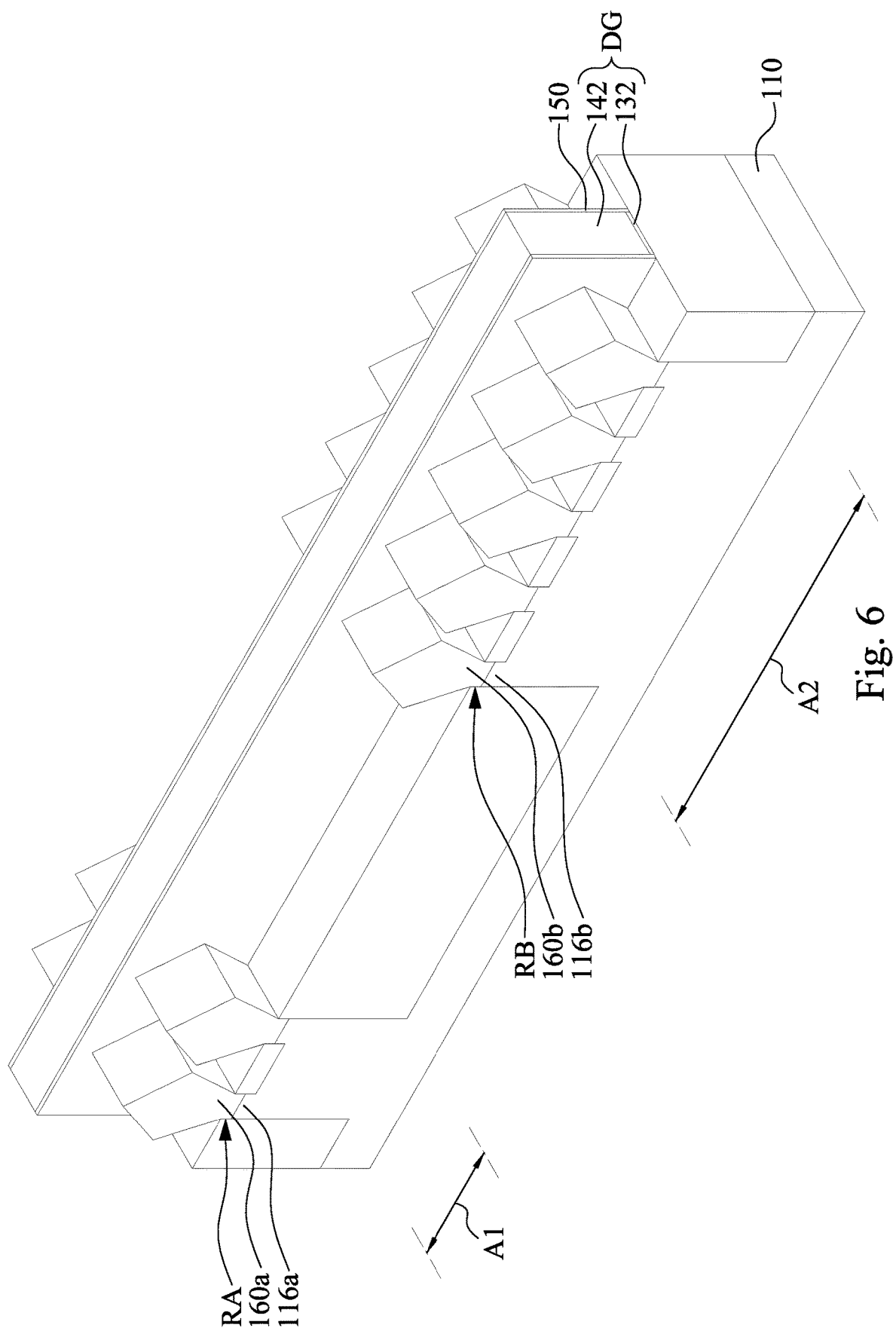

Reference is made to FIG. 6. A plurality of source/drain features 160a and 160b are respectively formed in the recesses RA and RB of the semiconductor fins 116a and 116b of the substrate 110. In some embodiments, the source/drain features 160a and 160b may be epitaxy structures, and may also be referred to as epitaxy features 160a and 160b. The source/drain features 160a and 160b may be formed using one or more epitaxy or epitaxial (epi) processes, such that Si features, SiGe features, and/or other suitable features can be formed in a crystalline state on the semiconductor fins 116a and 116b. In some embodiments, lattice constants of the source/drain features 160a and 160b are different from lattice constants of the semiconductor fins 116a and 116b, such that channels in the channel portions 116ac and 116bc of the semiconductor fins 116a and 116b (referring to FIG. 5) are strained or stressed to enable carrier mobility of the semiconductor device and enhance the device performance. In some embodiments, the source/drain features 160a and 160b may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 116a and 116b (e.g., silicon). The source/drain features 160a and 160b may be in-situ doped. The doping species include P-type dopants, such as boron or $BF_2$; N-type dopants, such as phosphorus or arsenic; and/or other suitable dopants including combinations thereof. The source/drain features 160a and 160b abutting the dummy gate structure DG may be doped with dopants of the same or different conductive types. If the source/drain features 160a and 160b are not in-situ doped, a second implantation process (i.e., a junction implant process) is performed to dope the source/drain features 160a and 160b. One or more annealing processes may be performed to activate the source/drain features 160a and 160b. The annealing processes include rapid thermal annealing (RTA) and/or laser annealing processes.

Figure 7:
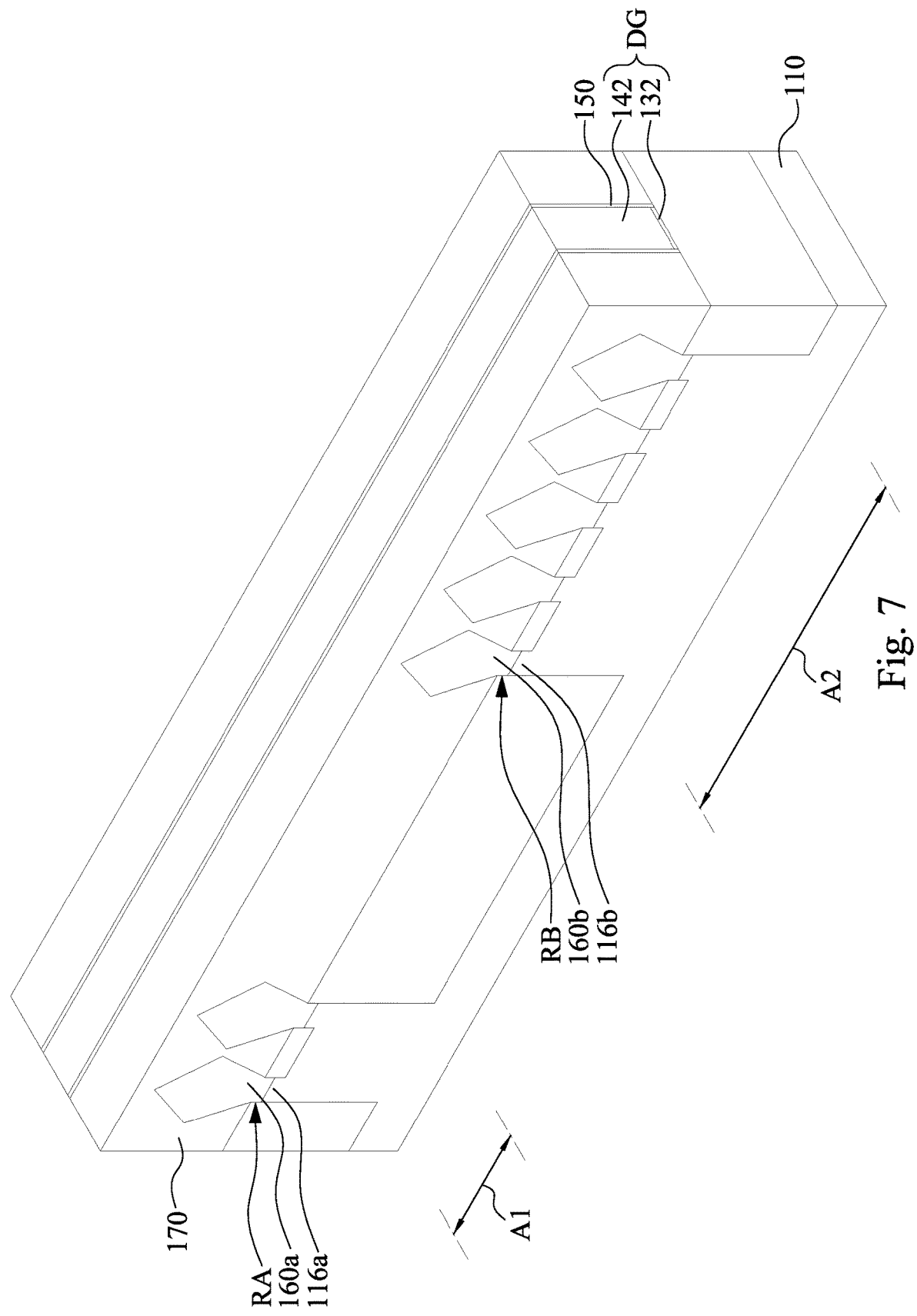

Reference is made to FIG. 7. After the source/drain features 160a and 160b are formed, an interlayer dielectric (ILD) 170 is formed over the substrate 110 and surrounding the source/drain features 160a and 160b. The ILD 170 may include silicon oxide, oxynitride or other suitable materials. The ILD 170 includes a single layer or multiple layers. The ILD 170 can be formed by a suitable technique, such as CVD or ALD. A chemical mechanical polishing (CMP) process may be performed to remove an excess portion of the ILD 170 until reaching the dummy gate structure DG. After the chemical mechanical planarization (CMP) process, the dummy gate structure DG is exposed from the ILD 170. In some embodiments, a contact etch stop layer (CESL) may be blanket formed over the substrate 110 prior to the formation of the ILD 170.

Figure 8:
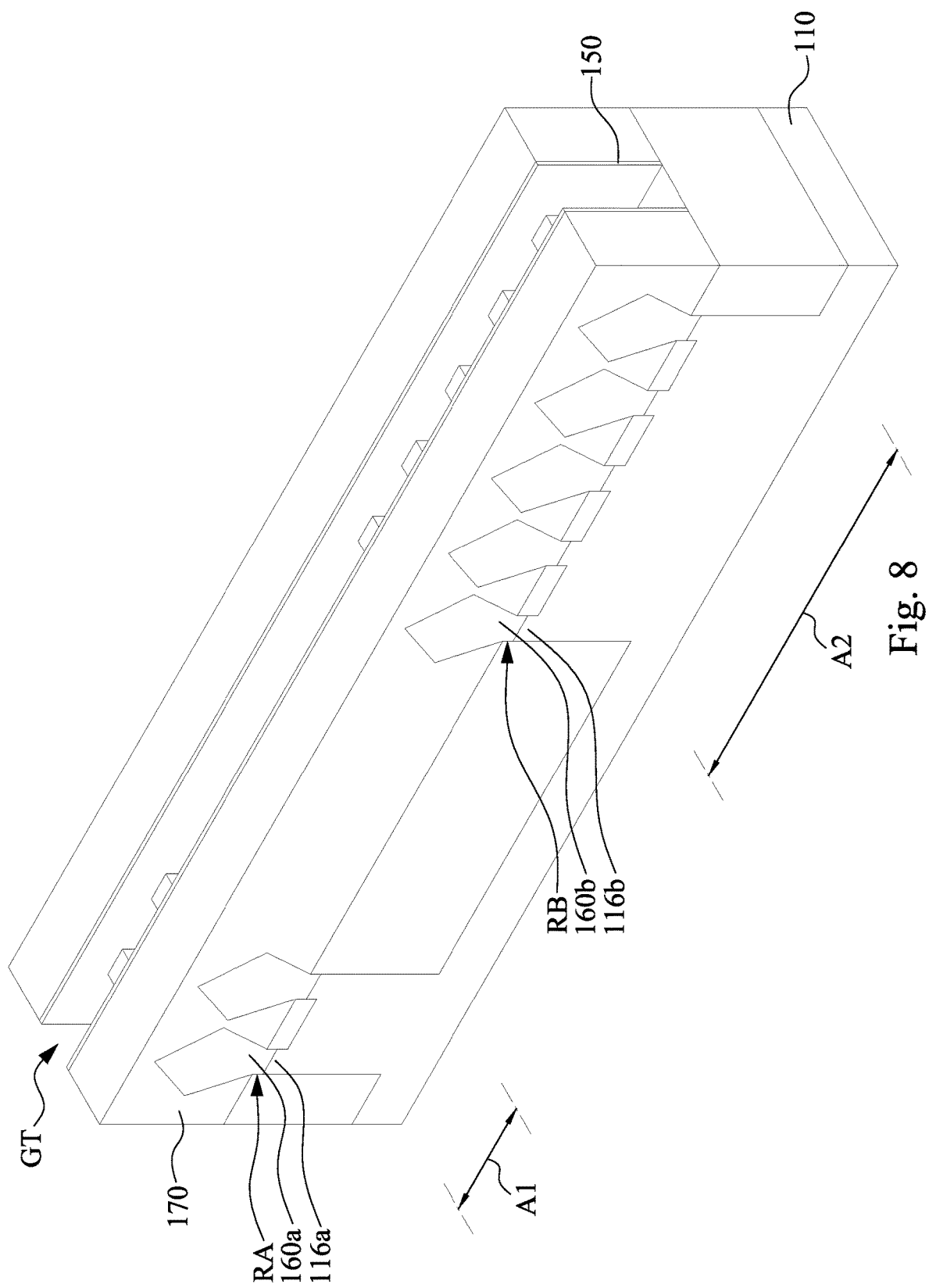

Reference is made to FIG. 8. The dummy gate structure DG is removed, and a gate trench GT is left with the gate spacers 150 as their sidewalls. The gate trench GT exposes channel portions 116ac and 116bc of the semiconductor fins 116a and 116b of the substrate 110 (referring to FIG. 5). In some embodiments, the dummy gate structure DG is removed by performing a first etching process and performing a second etching process after the first etching process. In some embodiments, the dummy gate 142 is mainly removed by the first etching process, and the gate dielectric 132 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W. In some other embodiments, the dummy gate 142 is removed, while the gate dielectric 132 remains in the gate trenches.

Figure 9A:
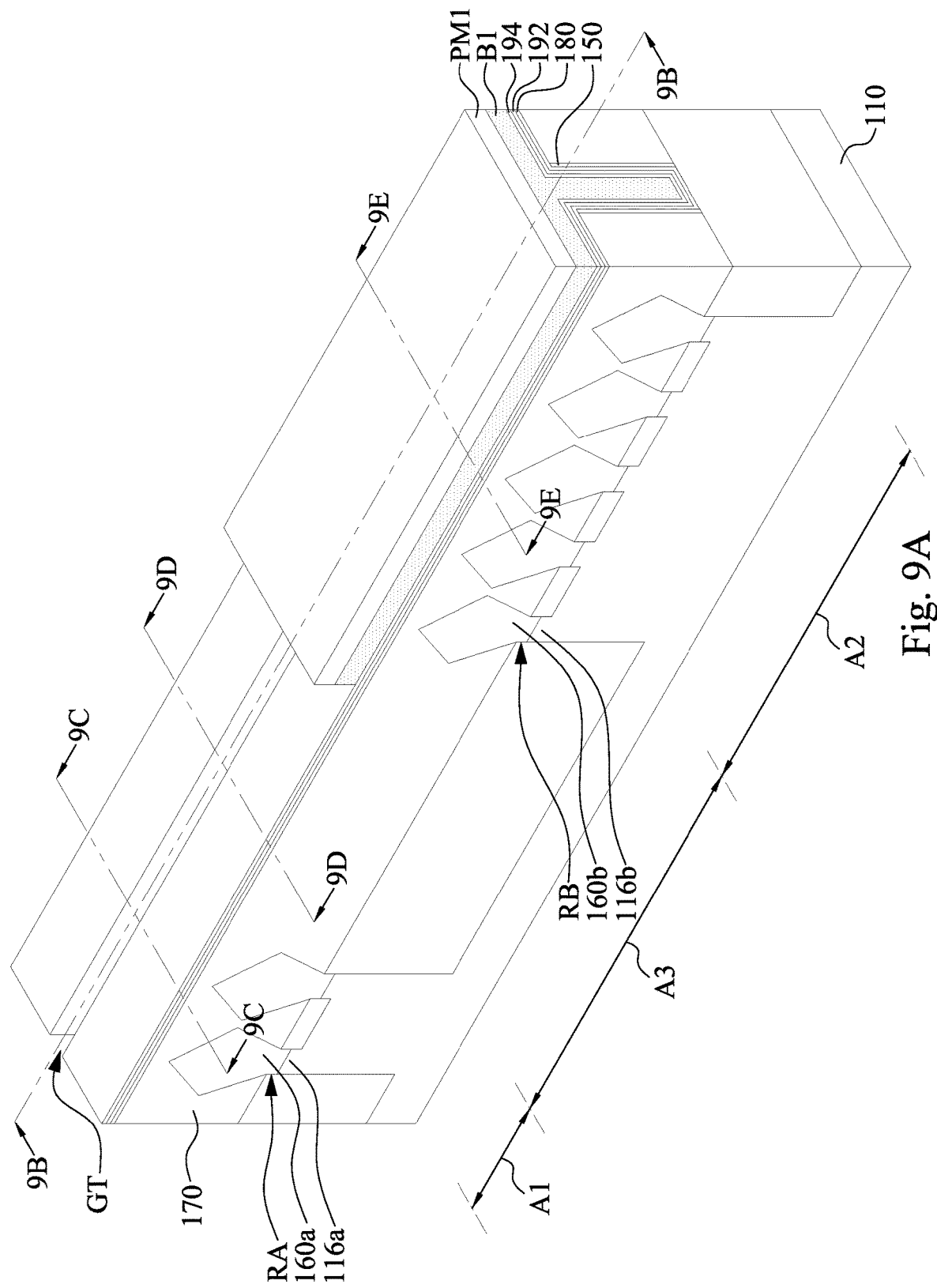
Figure 9B:
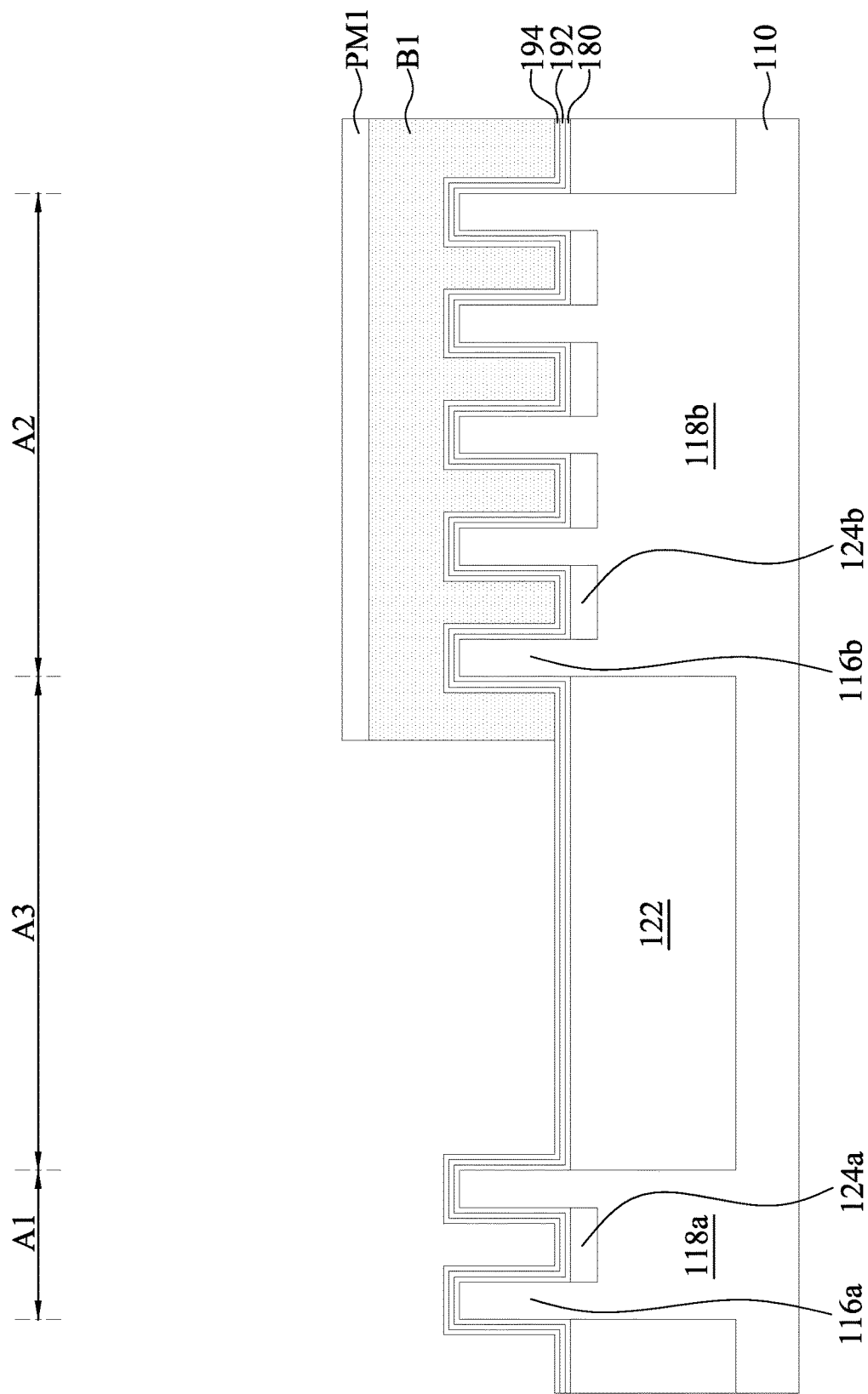
Figure 9E:
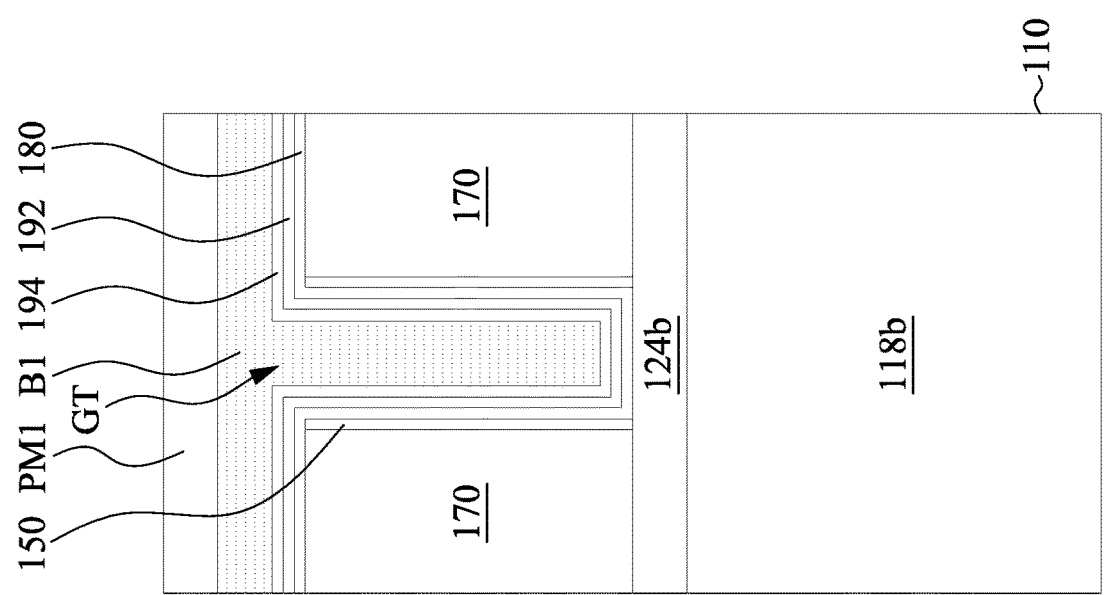
Figure 9D:
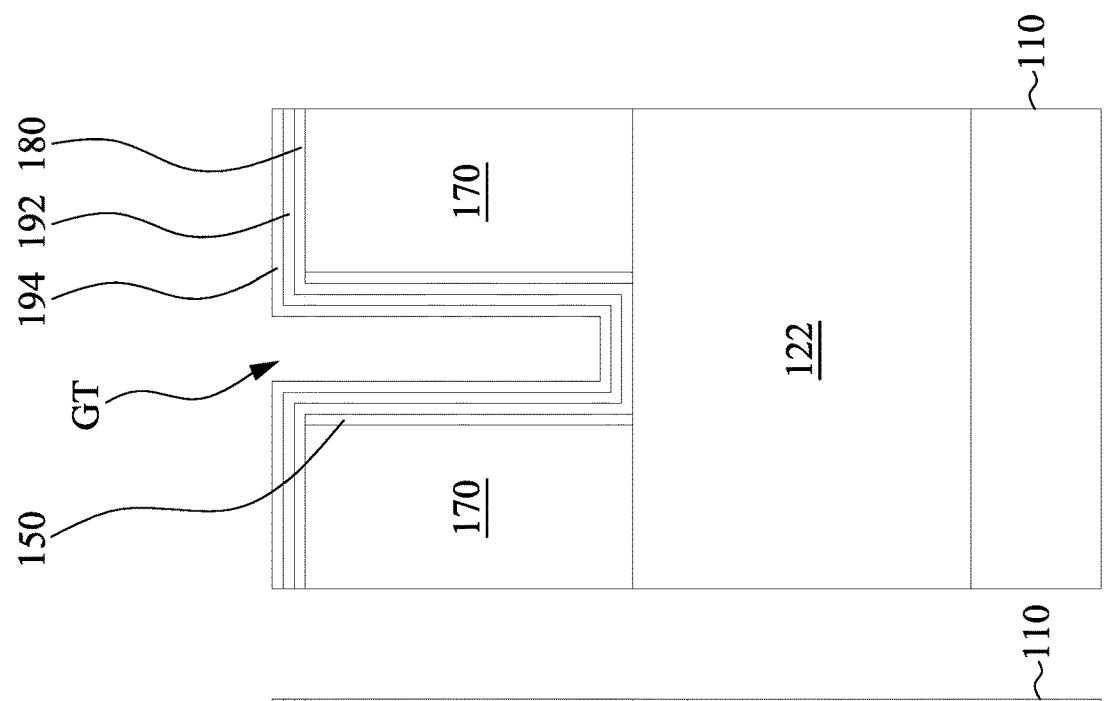
Figure 9C:
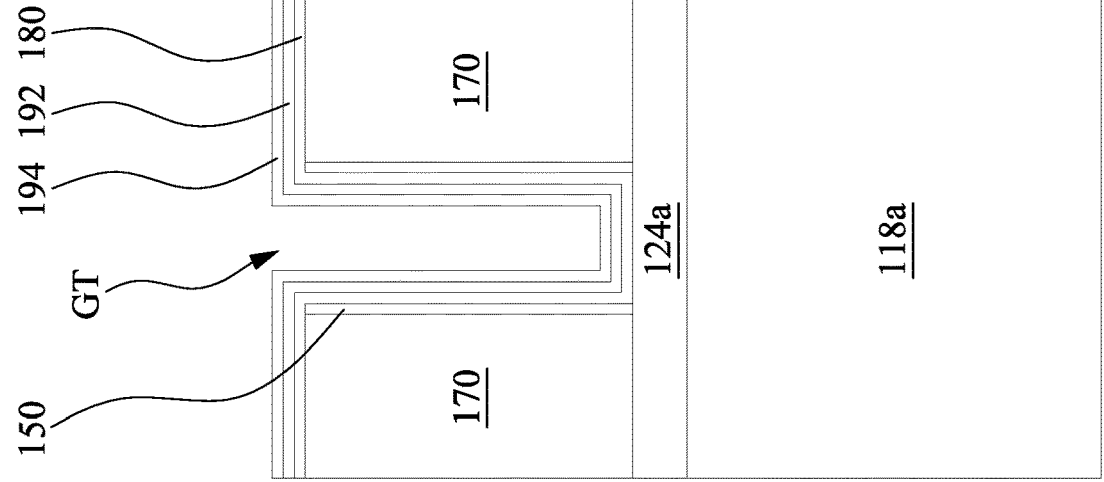

Reference is made to FIGS. 9A-9E. FIG. 9B is a cross-sectional view taken along line 9B-9B of FIG. 9A. FIG. 9C is a cross-sectional view taken along line 9C-9C of FIG. 9A. FIG. 9D is a cross-sectional view taken along line 9D-9D of FIG. 9A. FIG. 9E is a cross-sectional view taken along line 9E-9E of FIG. 9A. A gate dielectric layer 180 is conformally formed in the gate trench GT, and work function metal layers 192 and 194 are conformally formed over the gate dielectric layer 180 in the gate trench GT. The gate dielectric layer 180, as used and described herein, include dielectric materials having a high dielectric constant, for example, greater than that of thermal silicon oxide (~3.9). The gate dielectric layer 180 may include a high-K dielectric layer such as tantalum, hafnium, titanium, lanthanum, aluminum and their carbide, silicide, nitride, boride combinations. The gate dielectric layer 180 may include other high-K dielectrics, such as $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 180 may be formed by ALD, PVD, CVD, oxidation, and/or other suitable semiconductor devices. In some embodiments, the gate dielectric layer 180 may include the same or different materials.

The work function metal layers 192 and 194 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layers 192 and 194 may include a plurality of layers. The work function metal layers 192 and 194 may be deposited by CVD, PVD, electro-plating and/or other suitable process. In some embodiments, the work function metal layers 192 and 194 may include the same or different materials.

Herein, a bottom anti-reflective coating (BARC) layer B1 is formed over the work function metal layer 194 in the second area A2 of the substrate 110, and a patterned mask layer PM1 is formed over BARC layer B1. The BARC layer B1 and the patterned mask layer PM1 covers the second area A2, and does not cover the first area A1. The BARC layer B1 and the patterned mask layer PM1 may cover a portion of a third area A3 between the first area A1 and the second area A2 and not cover another portion of the third area. In some embodiments, while there are the fins 116a in the first area A1, and the fins 116b in the second area A2, there is no fin in the third area A3. In the present embodiments, the BARC layer B1 may overfill the gate trench GT in the second area A2. The BARC layer B1 and the patterned mask layer PM1 protect the materials in the second area A2 in the subsequent process.

To be specific, a fluid material, with a good void filling capability, is formed on the work function metal layer 194, forming a planarized sacrificial layer. The sacrificial layer, for example, an organic material used for the bottom anti-reflection coating (BARC). Subsequently, a photoresist layer is formed over the planarized sacrificial layer. Then, the photoresist layer is photo-exposed and then chemically developed to form a patterned mask layer PM1 that covers the second area A2 and expose the sacrificial layer in the first and third areas A1 and A3. An etching operation is conducted using the patterned mask layer PM1 as a mask to remove an exposed portion of the sacrificial layer and leave a portion of the sacrificial layer that is referred to as BARC layer B1.

Figure 10A:
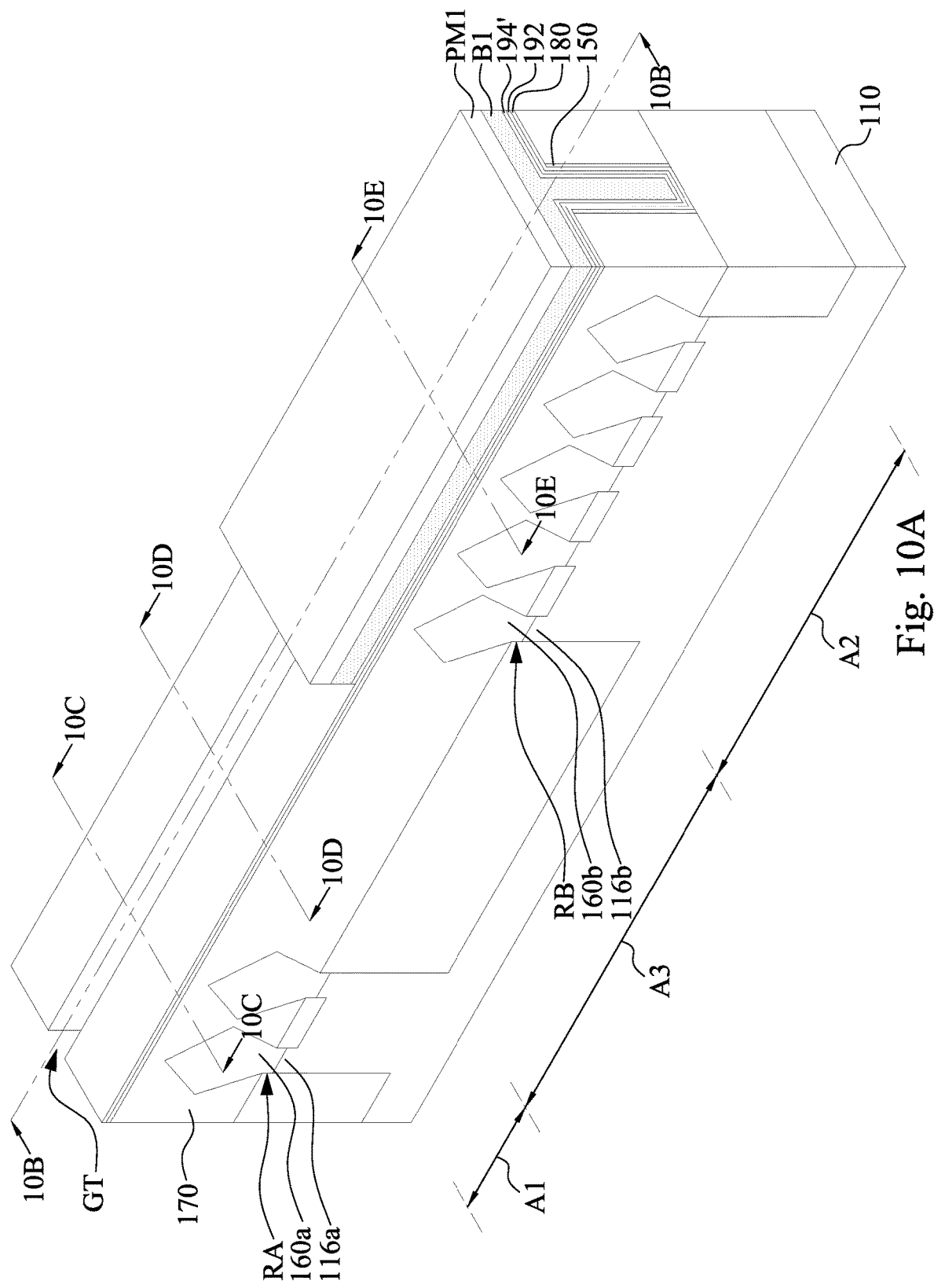
Figure 10B:
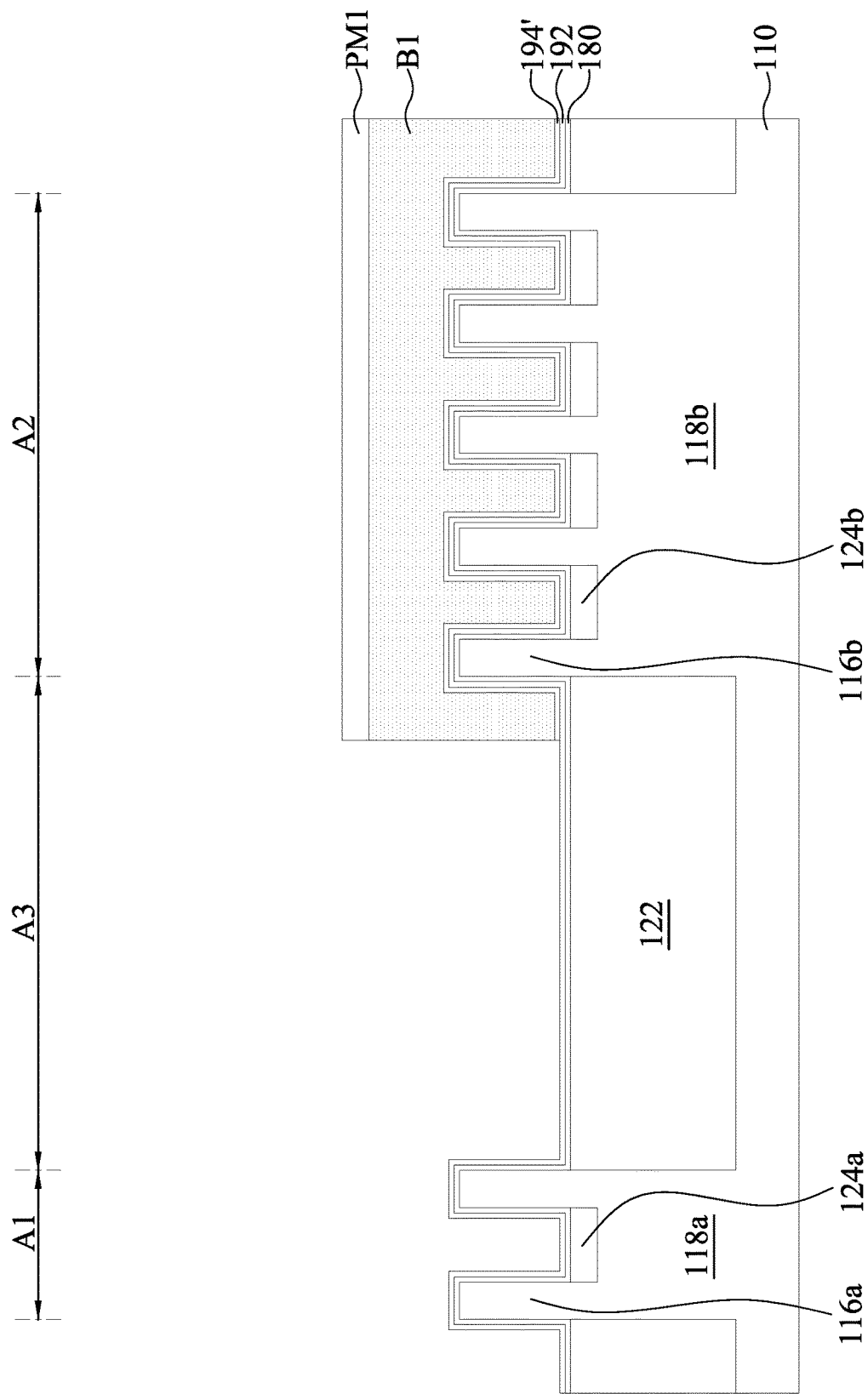
Figure 10E:
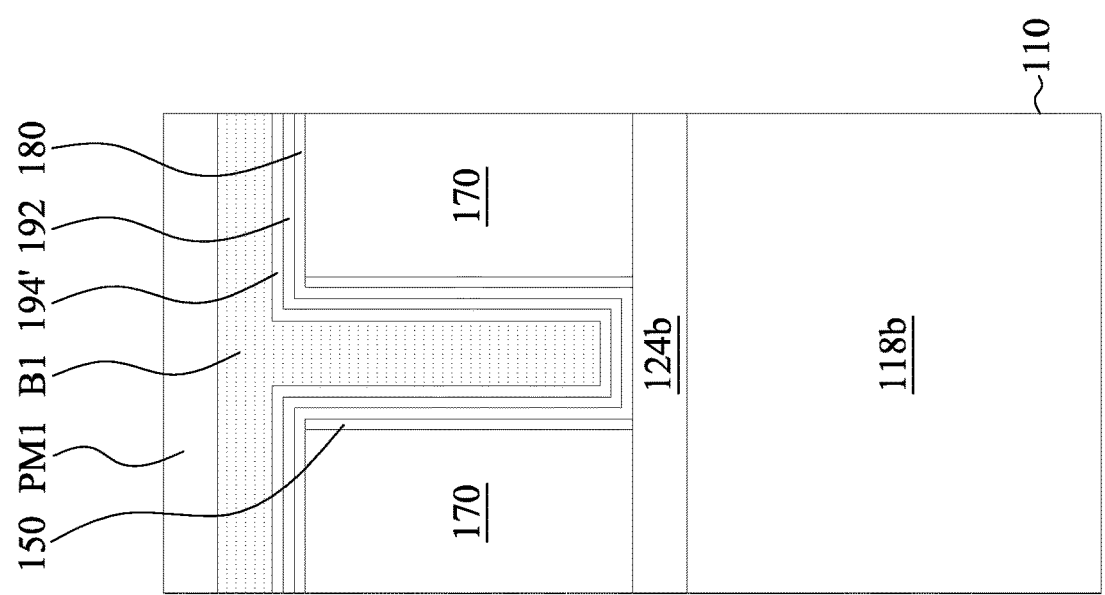
Figure 10D:
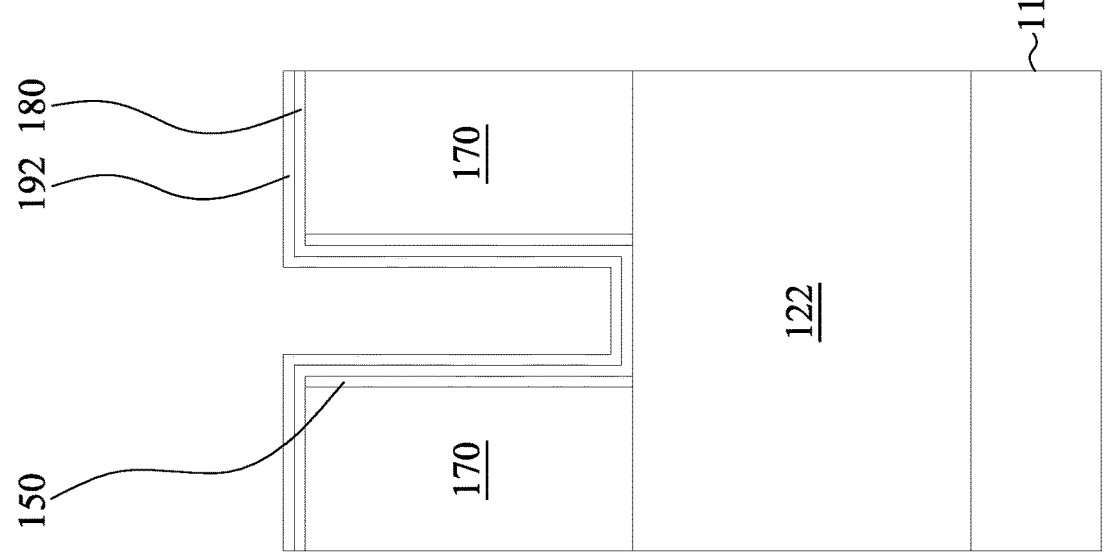
Figure 10C:
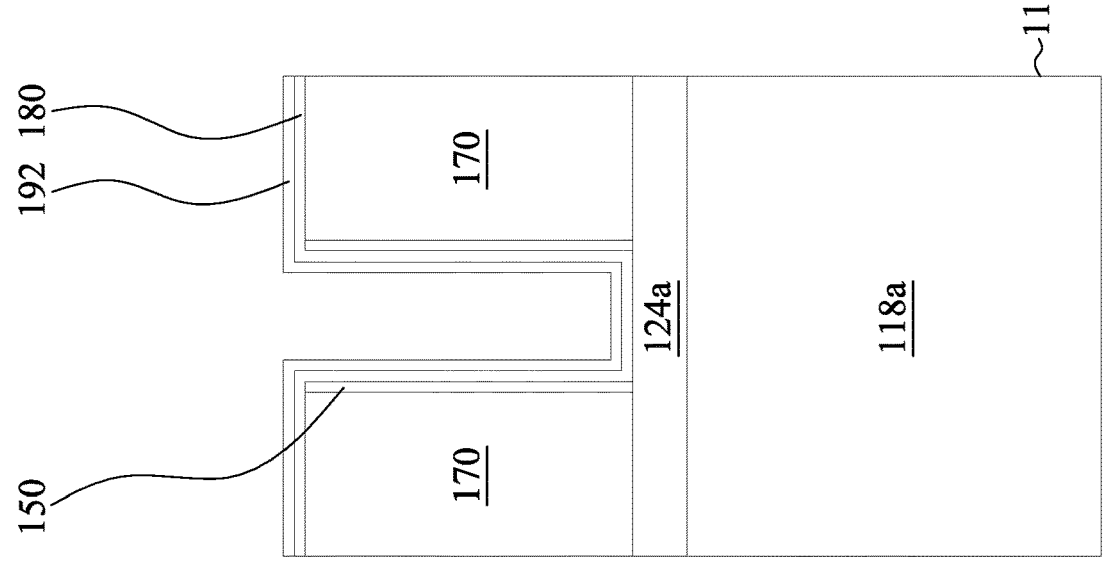

Reference is made to FIGS. 10A-10E. FIG. 10B is a cross-sectional view taken along line 10B-10B of FIG. 10A. FIG. 10C is a cross-sectional view taken along line 10C-10C of FIG. 10A. FIG. 10D is a cross-sectional view taken along line 10D-10D of FIG. 10A. FIG. 10E is a cross-sectional view taken along line 10E-10E of FIG. 10A. A portion of the work function metal layer 194 uncovered by the BARC layer B1 and the patterned mask layer PM1 is removed. Herein, an etch process is performed to remove a portion of the work function metal layer 194 in the first and third areas A1 and A3 of the substrate 110, while the portion of the work function metal layer 194 in the second area A2 of the substrate 110 remain intact by the protection of the BARC layer B2 and the patterned mask layer PM2. The remaining portion of the work function metal layer 194 may also be referred to as the work function metal layer 194' hereinafter. After the etching process, the BARC layer B1 and the patterned mask layer PM1 may be removed by suitable processes.

Figure 11A:
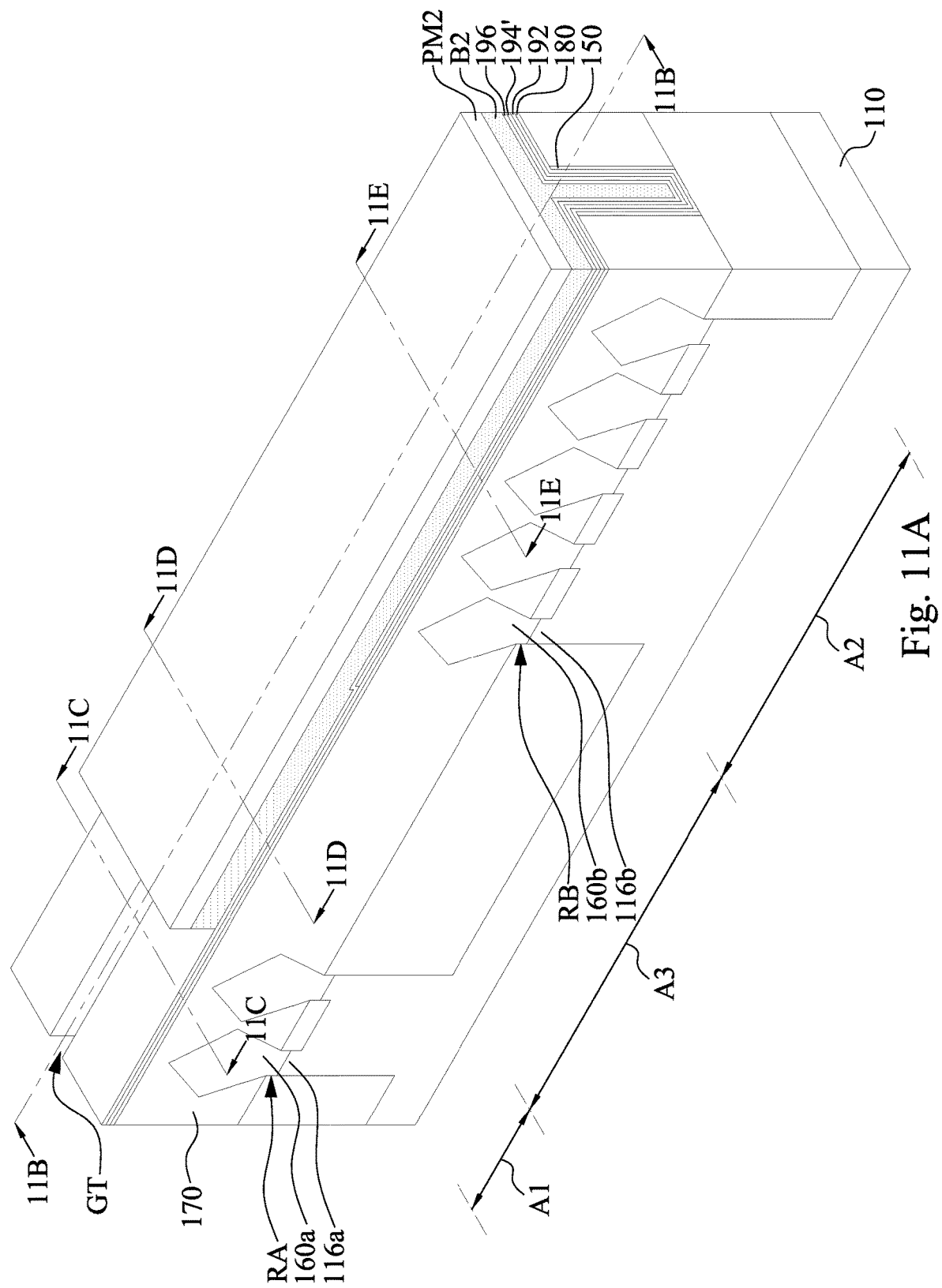
Figure 11B:
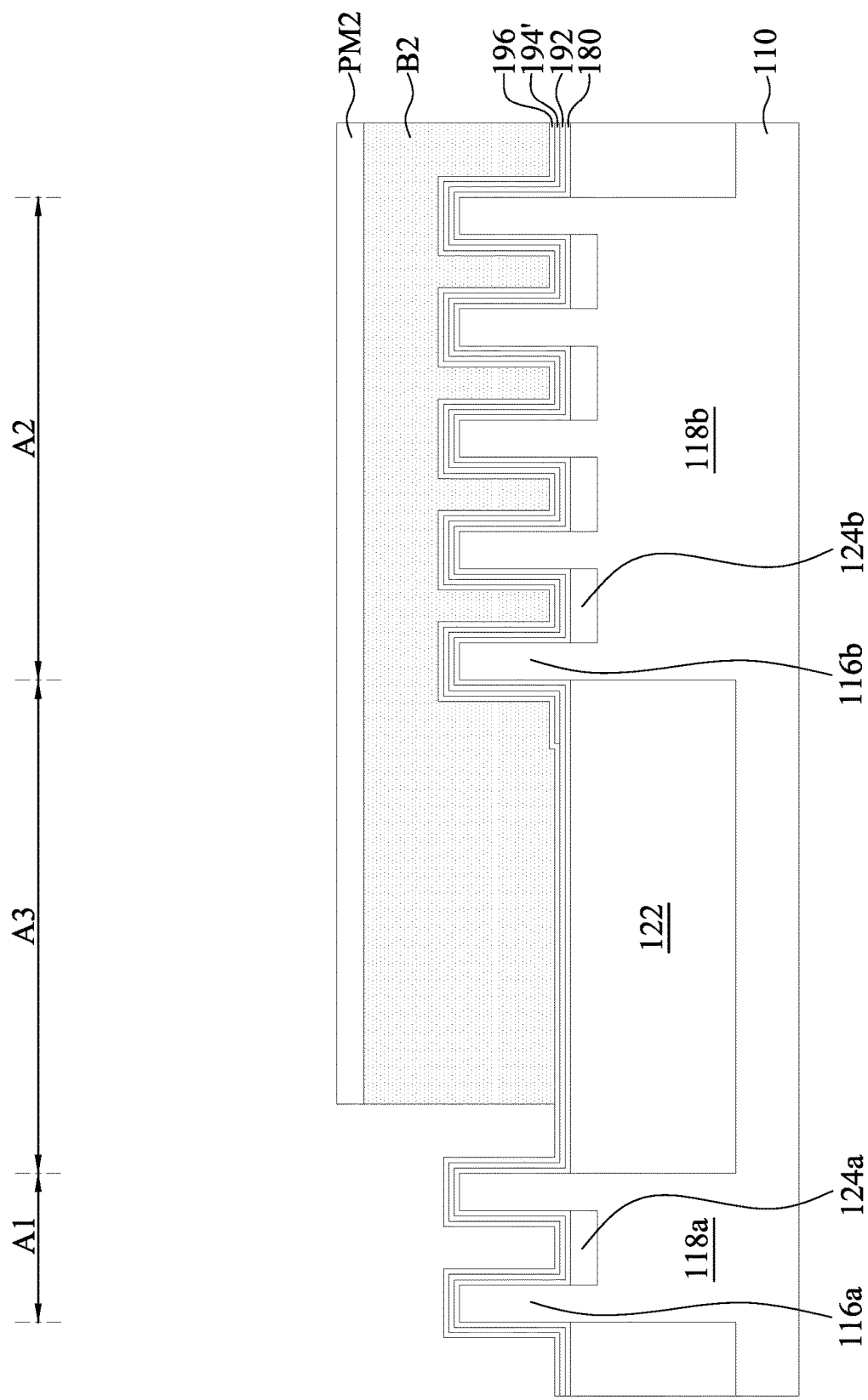

Reference is made to FIGS. 11A-11E. FIG. 11B is a cross-sectional view taken along line 11B-11B of FIG. 11A. FIG. 11C is a cross-sectional view taken along line 11C-11C of FIG. 11A. FIG. 11D is a cross-sectional view taken along line 11D-11D of FIG. 11A. FIG. 11E is a cross-sectional view taken along line 11E-11E of FIG. 11A. A work function metal layer 196 is formed over the work function metal layers 192 and 194' in the gate trench GT. For example, the work function metal layer 196 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layer 196 may include a plurality of layers. The work function metal layer 196 may be deposited by CVD, PVD, electro-plating and/or other suitable process. In some embodiments, the work function metal layer 196 may include the same or different materials.

In some embodiments, a BARC layer B2 is formed over the work function metal layer 196 in the second and third areas A2 and A3 of the substrate 110, and a patterned mask layer PM2 is formed over BARC layer B2. The formation steps of the BARC layer B2 and the patterned mask layer PM2 are similar to those of the BARC layer B1 and the patterned mask layer PM1 in FIGS. 9A-9E. The BARC layer B2 and the patterned mask layer PM2 covers the second area A2 and the third area A3, and does not cover the first area A1. In the present embodiments, the BARC layer B2 may overfill the gate trench GT. The BARC layer B2 and the patterned mask layer PM2 protect the materials in the second area A2 and the third area A3 in the subsequent process.

Figure 12A:
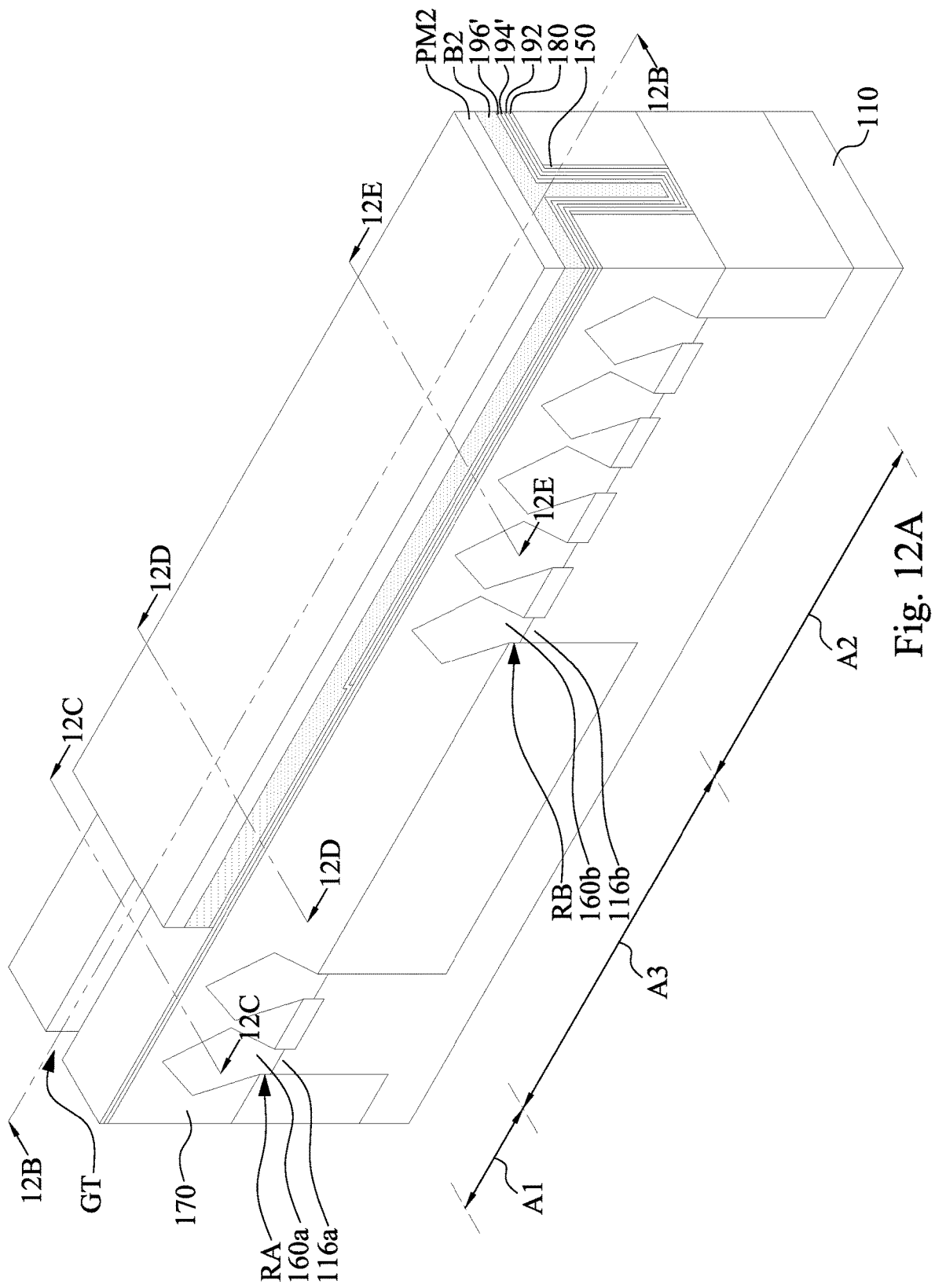
Figure 12B:
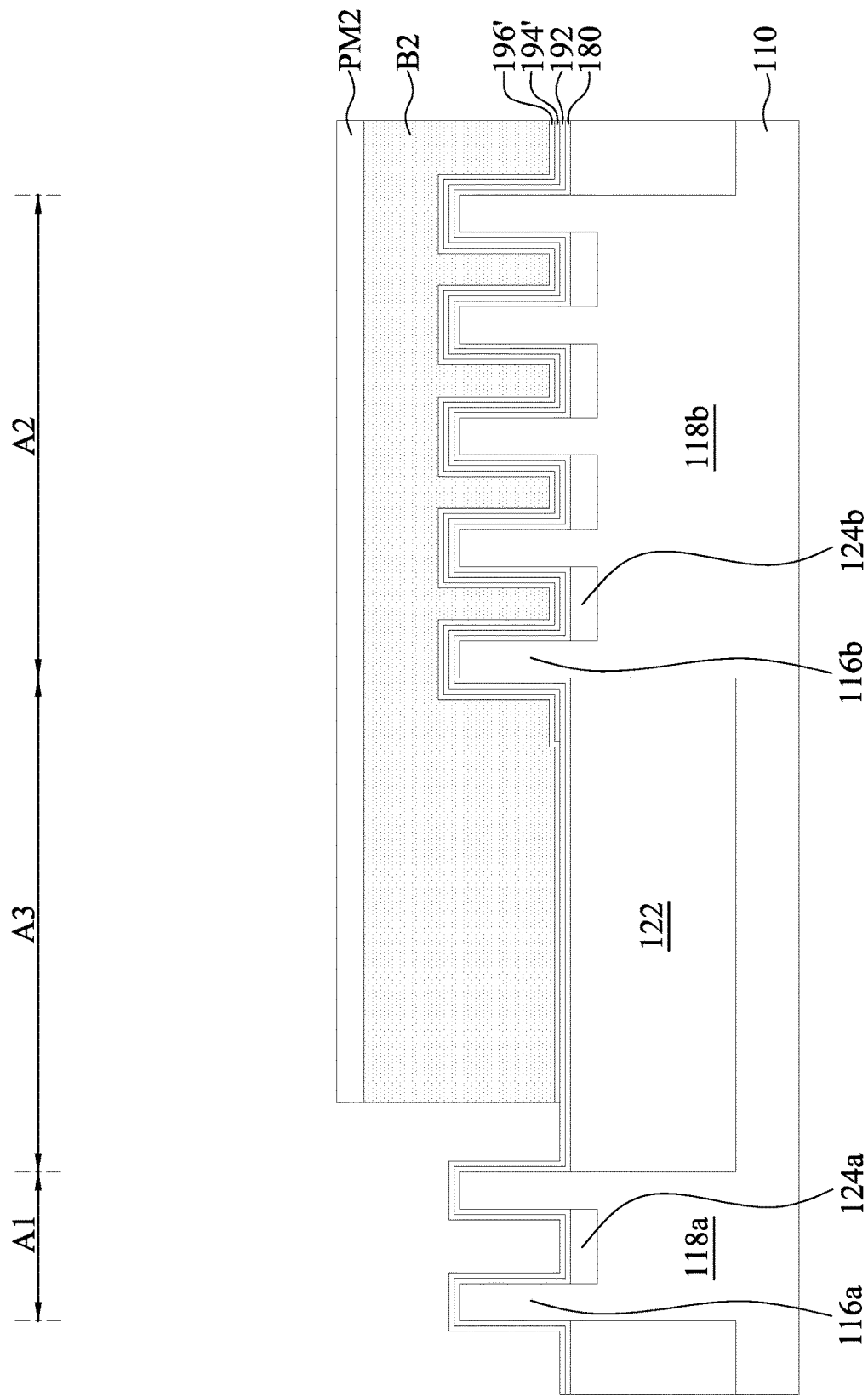

Reference is made to FIGS. 12A-12E. FIG. 12B is a cross-sectional view taken along line 12B-12B of FIG. 12A. FIG. 12C is a cross-sectional view taken along line 12C-12C of FIG. 12A. FIG. 12D is a cross-sectional view taken along line 12D-12D of FIG. 12A. FIG. 12E is a cross-sectional view taken along line 12E-12E of FIG. 12A. A portion of the work function metal layer 196 uncovered by the BARC layer B2 and the patterned mask layer PM2 is removed. Herein, an etch process is performed to remove a portion of the work function metal layer 196 in the first area A1 of the substrate 110, while the portion of the work function metal layer 196 in the second and third areas A2 and A3 of the substrate 110 remain intact by the protection of the BARC layer B2 and the patterned mask layer PM2. The remaining portion of the work function metal layer 196 may also be referred to as the work function metal layer 196' hereinafter. In the present embodiments, the BARC layer B2 may overfill the gate trench GT in the second area A2 and the third area A3. After the etch process, the BARC layer B2 and the patterned mask layer PM2 may be removed.

Figure 13A:
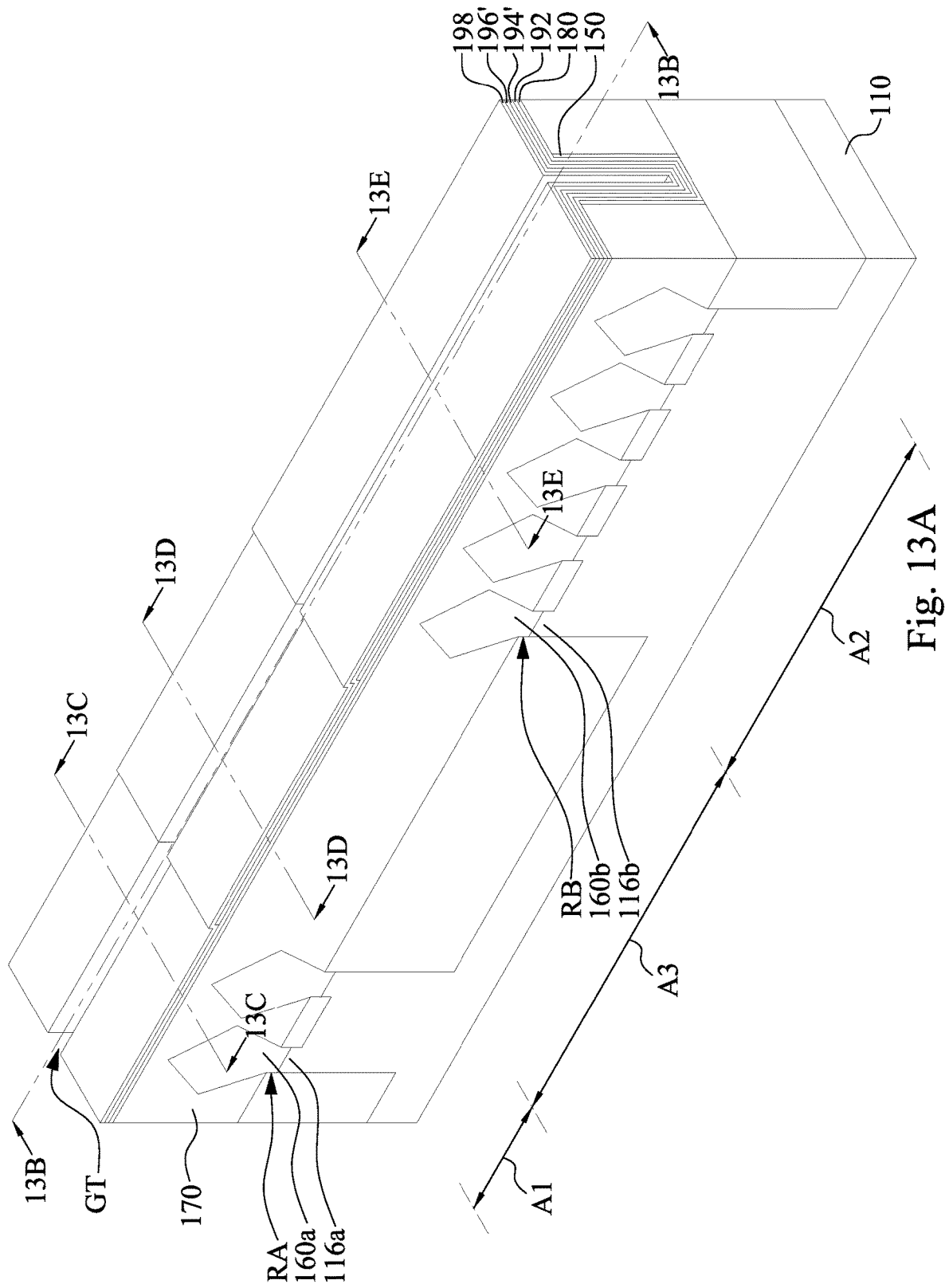
Figure 13B:
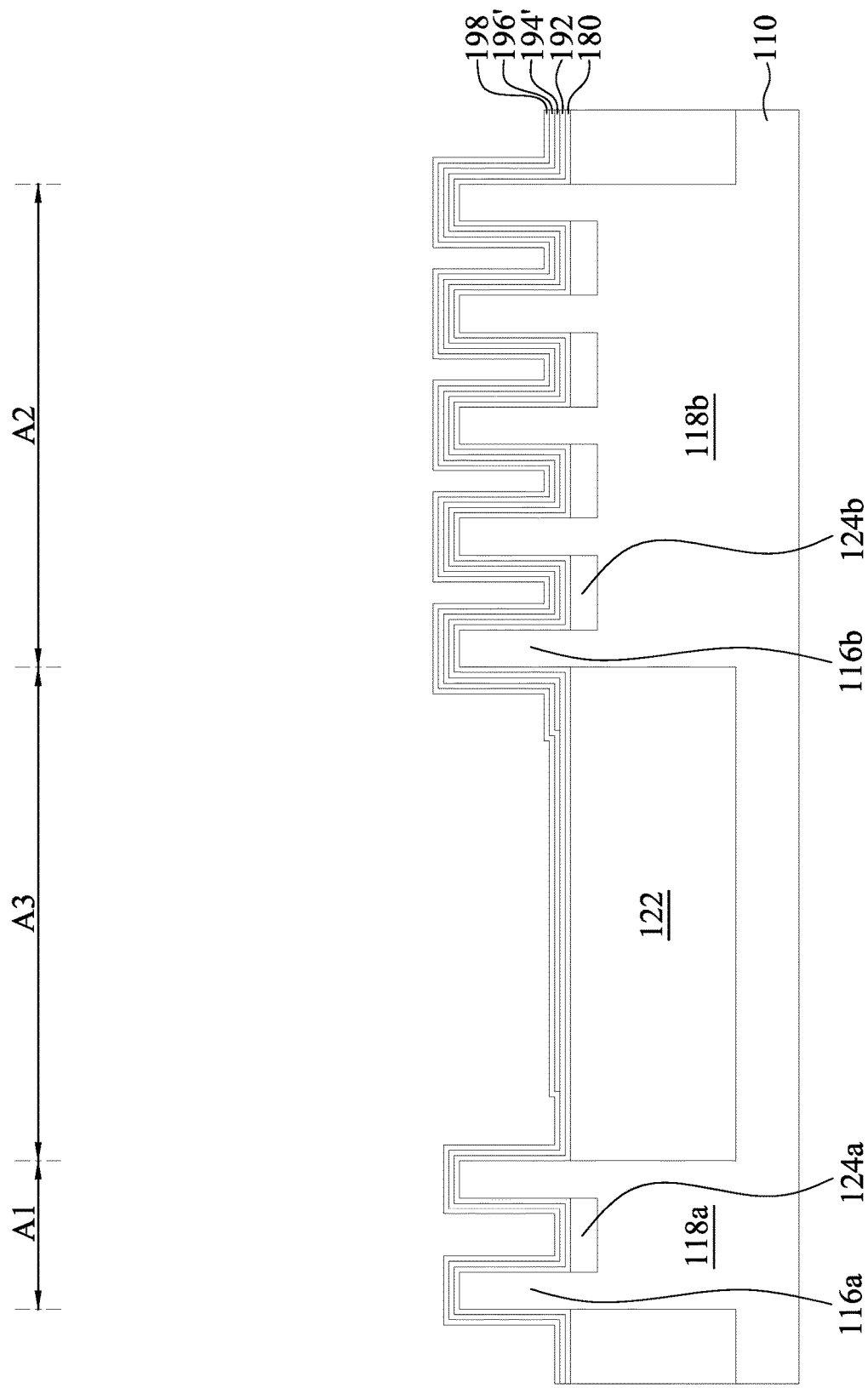
Figures 13C, 13D, 13E:
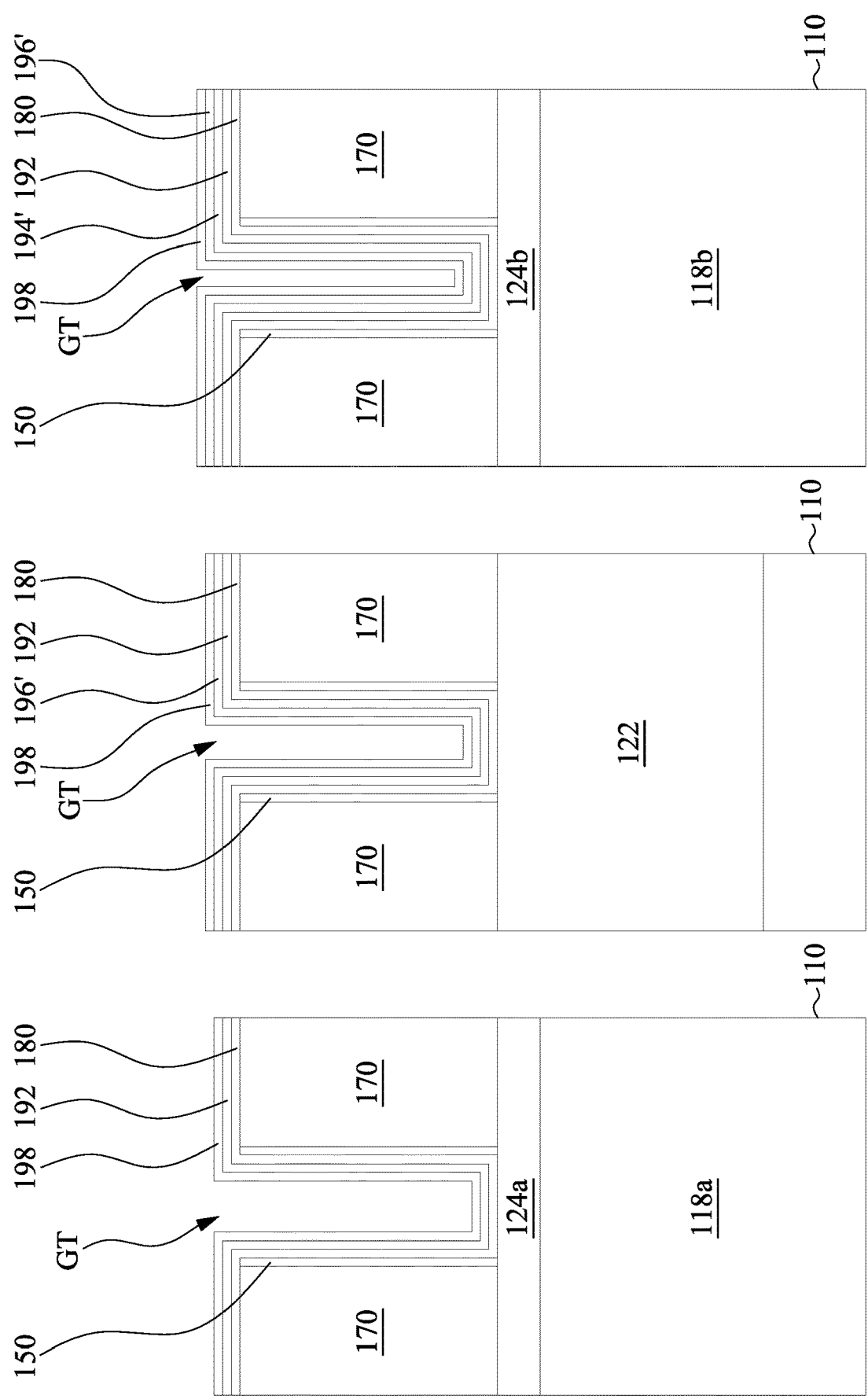

Reference is made to FIGS. 13A-13E. FIG. 13B is a cross-sectional view taken along line 13B-13B of FIG. 13A. FIG. 13C is a cross-sectional view taken along line 13C-13C of FIG. 13A. FIG. 13D is a cross-sectional view taken along line 13D-13D of FIG. 13A. FIG. 13E is a cross-sectional view taken along line 13E-13E of FIG. 13A. A work function metal layer 198 is formed over the work function metal layer 196' in the gate trench GT. For example, the work function metal layer 198 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layer 198 may include a plurality of layers. The work function metal layer 198 may be deposited by CVD, PVD, electro-plating and/or other suitable process. In some embodiments, the work function metal layer 198 may include the same or different materials. In some embodiments, the empty space of the gate trench GT in the third area A3 is much wider than that of second area A2 because the work function metal layer 194' is absent from the third area A3.

Figure 14A:
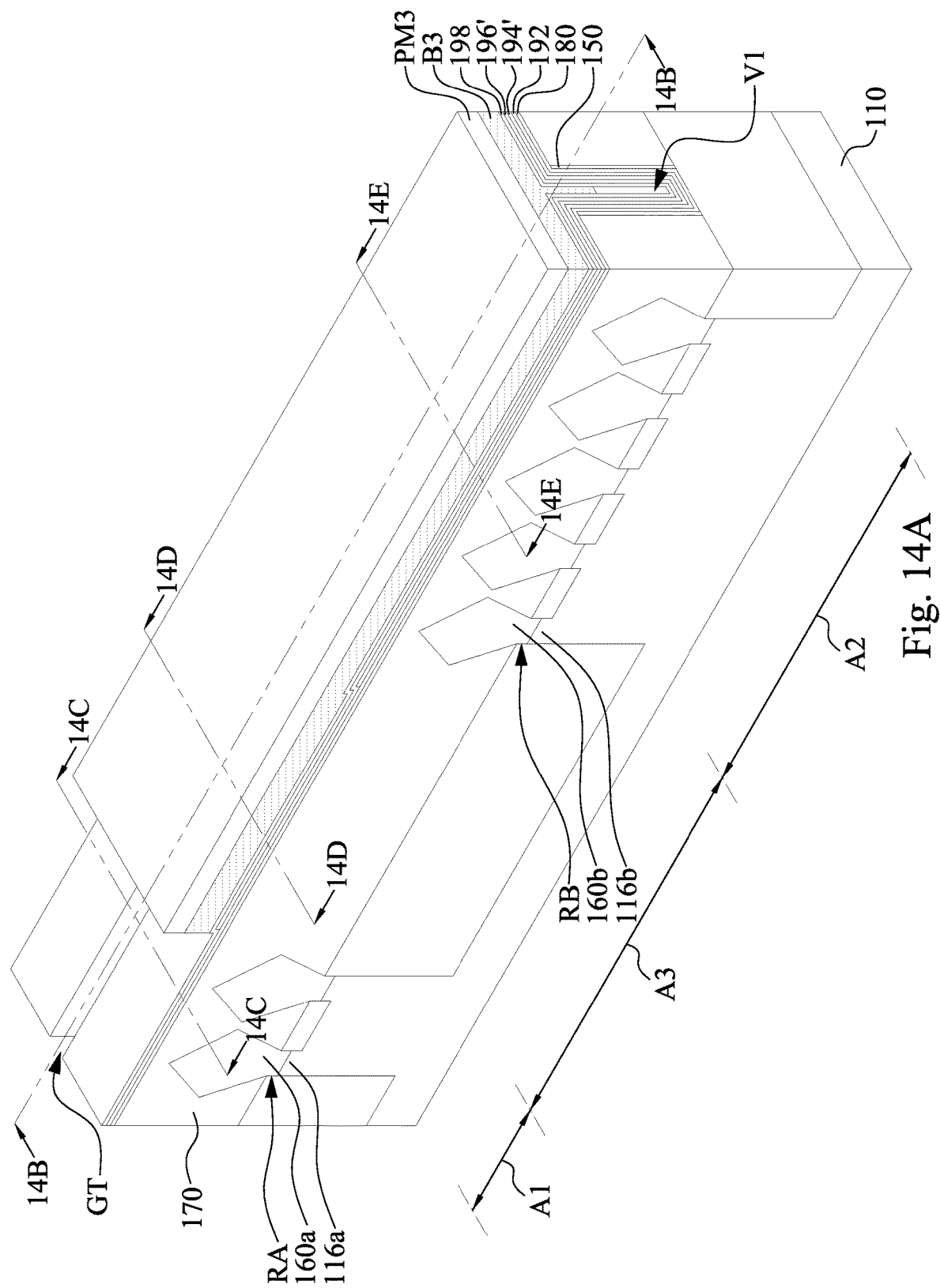
Figure 14B:
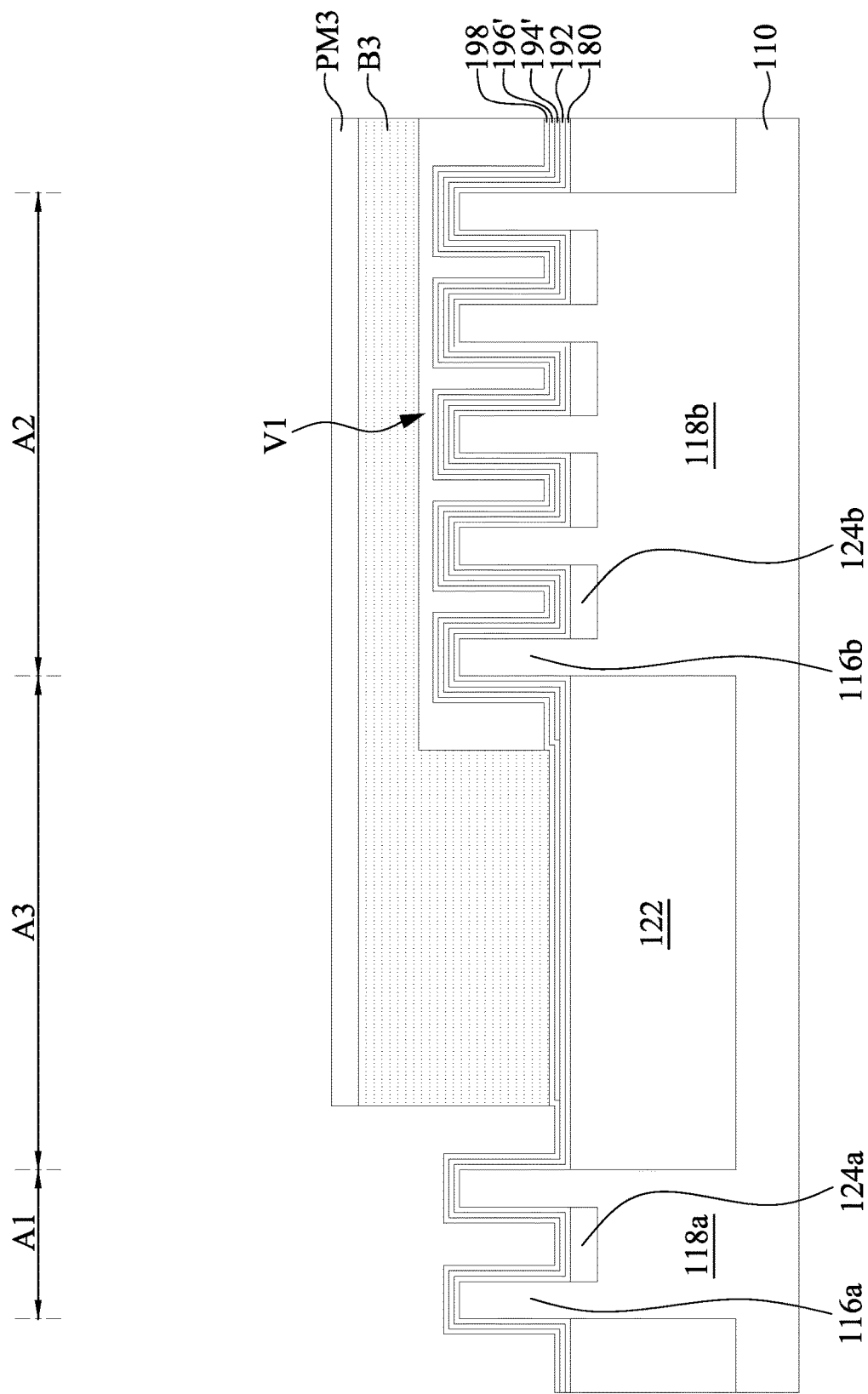

Reference is made to FIGS. 14A-14E. FIG. 14B is a cross-sectional view taken along line 14B-14B of FIG. 14A. FIG. 14C is a cross-sectional view taken along line 14C-14C of FIG. 14A. FIG. 14D is a cross-sectional view taken along line 14D-14D of FIG. 14A. FIG. 14E is a cross-sectional view taken along line 14E-14E of FIG. 14A. A BARC layer B3 is formed over the work function metal layer 198 in the second and third areas A2 and A3 of the substrate 110, and a patterned mask layer PM3 is formed over BARC layer B3. The formation steps of the BARC layer B3 and the patterned mask layer PM3 are similar to those of the BARC layer B1 and the patterned mask layer PM1 in FIGS. 9A-9E. Herein, due to the narrow space of the gate trench GT in the second area A2, the BARC layer B3 may not fill the gate trench GT. For example, there may be a void V1 between the BARC layer B3 and the work function metal layer 198 in the second area A2. That is, the BARC layer B3 in the second area A2 may not be in contact with a bottom portion of the work function metal layer 198. On the other hand, the gate trench GT in the third area A3 is designed with a wide space such that the BARC layer B3 in the third area A3 may fill the gate trench GT and be in contact with a bottom portion of the work function metal layer 198. In the present embodiments, the BARC layer B3 may overfill the gate trench GT in the second area A2 and the third area A3.

Figure 15A:
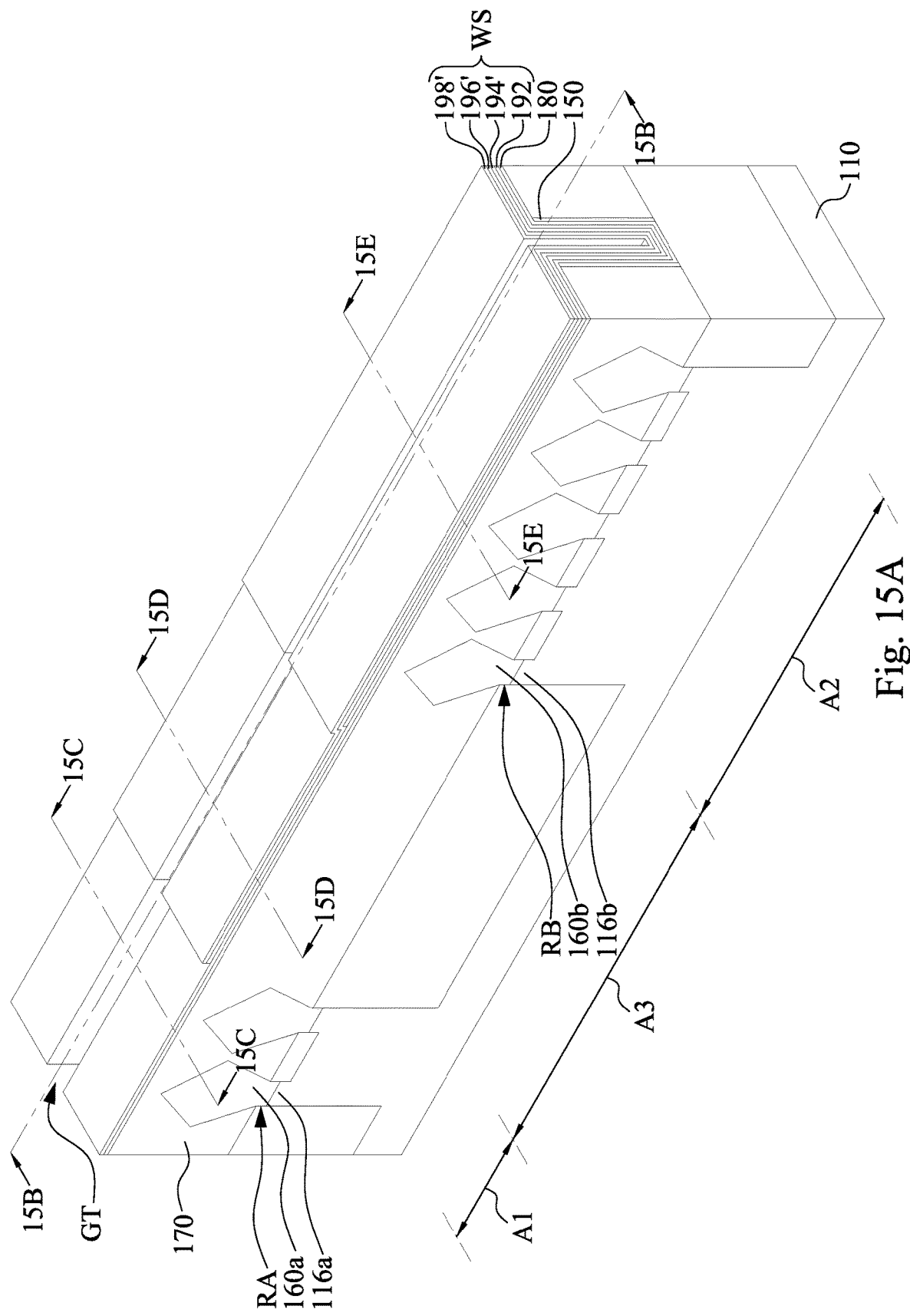
Figure 15B:
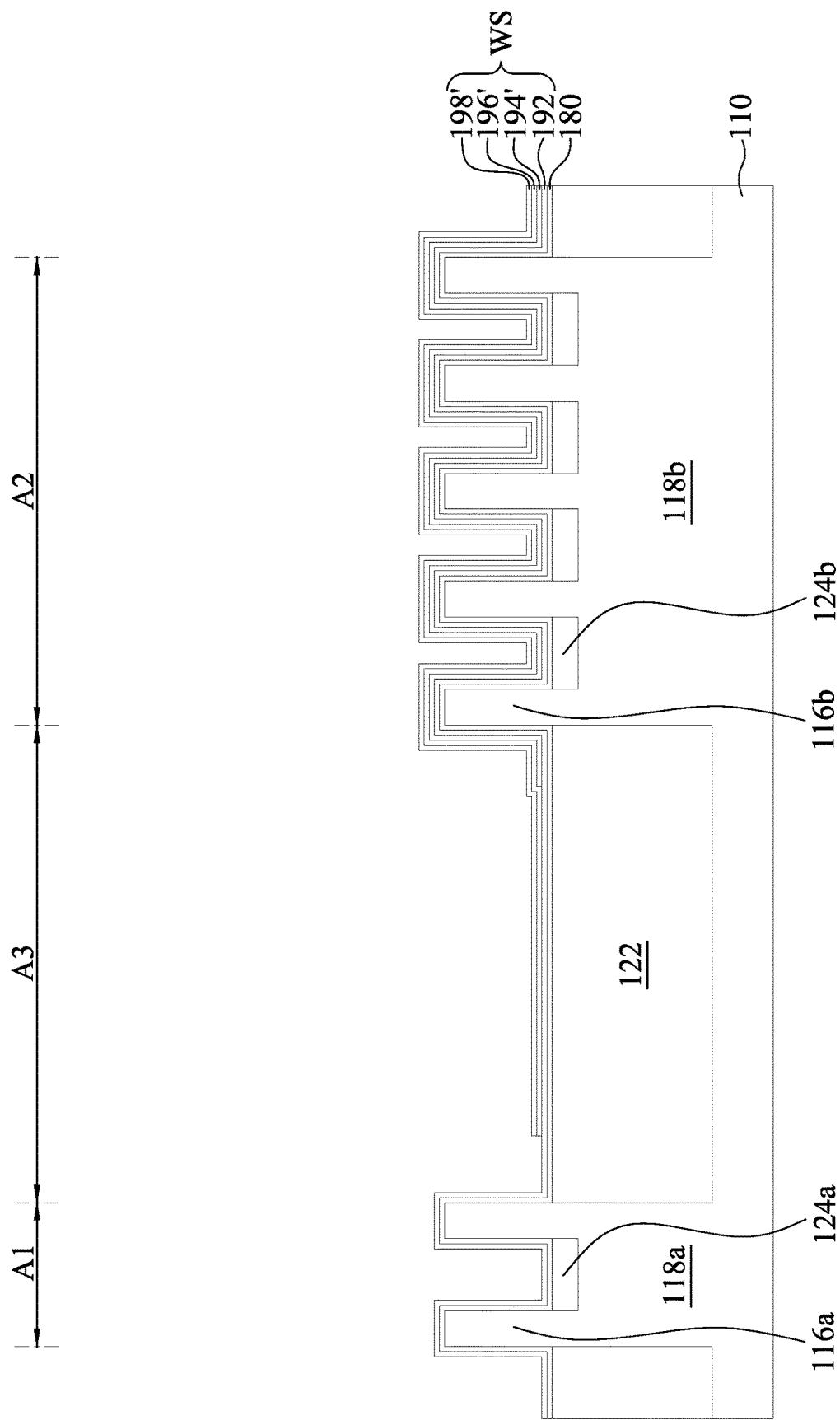

Reference is made to FIGS. 15A-15E. FIG. 15B is a cross-sectional view taken along line 15B-15B of FIG. 15A. FIG. 15C is a cross-sectional view taken along line 15C-15C of FIG. 15A. FIG. 15D is a cross-sectional view taken along line 15D-15D of FIG. 15A. FIG. 15E is a cross-sectional view taken along line 15E-15E of FIG. 15A. A portion of the work function metal layer 198 uncovered by the BARC layer B3 and the patterned mask layer PM3 is removed. Herein, an etching process is performed to remove a portion of the work function metal layer 198 in the first area A1 of the substrate 110, while the portion of the work function metal layer 198 in the second and third areas A2 and A3 of the substrate 110 remain intact by the protection of the BARC layer B3 and the patterned mask layer PM3. The remaining portion of the work function metal layer 198 may also be referred to as the work function metal layer 198' hereinafter. After the etch process, the BARC layer B3 and the patterned mask layer PM3 (referring to FIGS. 14A-14E) may be removed.

Reference is made to FIGS. 14A-14E and 15A-15E. In the absence of the third area A3, during the etching process, etchants or other liquid may flow form the first area A1 to the second area A2 through the void V1 between the BARC layer B3 and the work function metal layer 198, resulting undesired etching penetration. In the present embodiments, due to the presence of the third area A3, the void V1 is blocked by the BARC layer B3 in the third area A3, and etchants or other liquid are prevented from flowing to the void V1. Therefore, the undesired etching penetration is prevented. In some embodiments, a combination of the work function metal layers 192-198' may be referred to as work function metal structure WS.

Figure 16A:
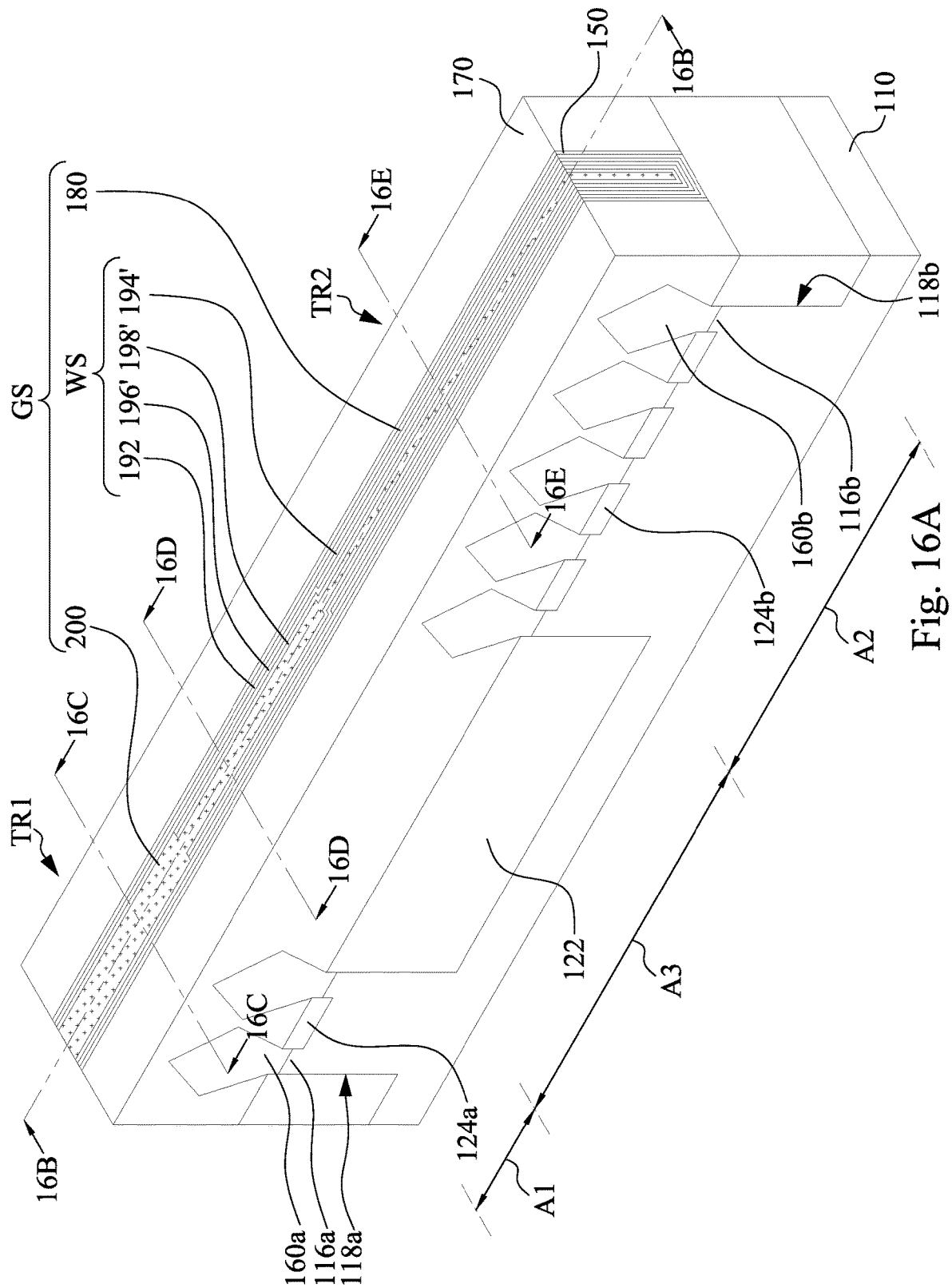
Figure 16B:
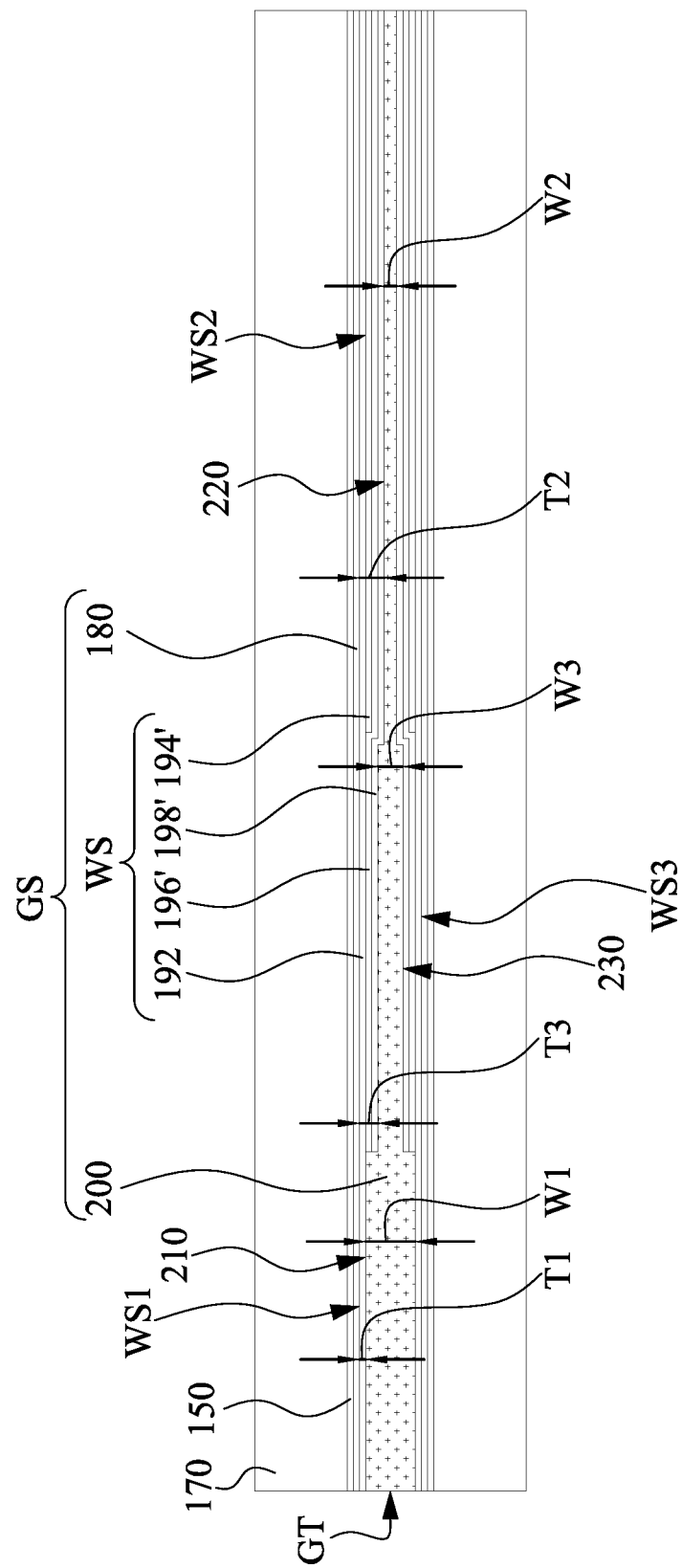
Figure 16C:
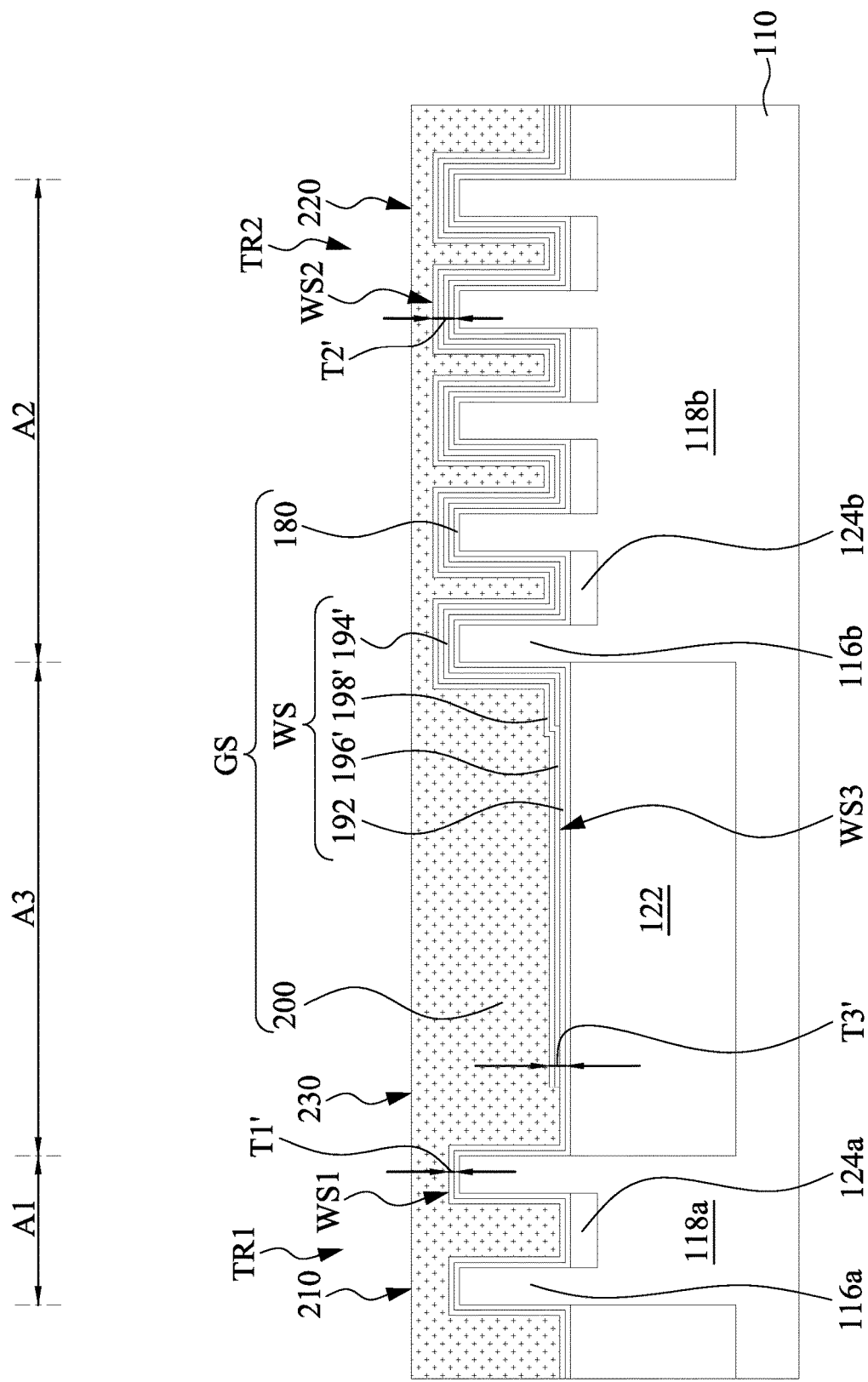

Reference is made to FIGS. 16A-16F. FIG. 16B is a schematic top view of FIG. 16A. FIG. 16C is a cross-sectional view taken along line 16C-16C of FIG. 16A. FIG. 16D is a cross-sectional view taken along line 16D-16D of FIG. 16A. FIG. 16E is a cross-sectional view taken along line 16E-16E of FIG. 16A. FIG. 16F is a cross-sectional view taken along line 16F-16F of FIG. 16A. A filling conductor 200 fills a recess in the work function metal structure WS. The filling conductor 200 may include metal or metal alloy. For example, the filling conductor 200 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, a chemical mechanical polishing process may be optionally performed, so as to level the top surfaces of the work function metal layers 192-198' and the filling conductor 200. The filling conductor 200 may be referred to as gate conductor in this context. In some embodiments, a combination of the gate dielectric layer 180, the work function metal layers 192-198', and the filling conductor 200 may be referred to as a gate structure GS.

A first transistor TR1 is formed in the first area A1, and a second transistor TR2 is formed in the second area A2. The first transistor TR1 includes the fins 116a, the crown base structure 118a, the source/drain features 160a, and a portion of the gate structure GS thereon. The second transistor TR2 includes the fins 116b, the crown base structure 118b, the source/drain features 160b, and another portion of the gate structure GS thereon. Herein, the portions of the gate structure GS in the first transistor TR1 and second transistor TR2 has a work function metal structure WS of different thicknesses, so as to tune the threshold voltages of the first transistor TR1 and second transistor TR2.

For example, herein, the work function metal structure WS has a portion WS1 in the first area A1, a portion WS2 in the second area A2, and a portion WS3 in the third area A3. In some embodiments, the portions WS1-WS3 are respectively over the crown base structure 118a, the crown base structure 118b, and the inter-device isolation structure 122. In some embodiments, the portions WS1 and WS2 are over the intra-device isolation structures 124a and 124b respectively. To be specific, the portion WS1 includes the work functional metal layer 192, the portion WS2 includes the work functional metal layers 192-198', and the portion WS3 includes the work functional metal layers 192, 196', and 198'. In some embodiments, a distance between the portion WS3 and the adjacent semiconductor fin 116a may be in a range of 10 nanometers to 300 nanometers.

Referring to FIGS. 16D-16F, the portions WS1-WS3 have thicknesses T1-T3 in a horizontal direction, respectively, and the portions WS1-WS3 have thicknesses T1'-T3' in a vertical direction. In some embodiments where deposition conditions are well controlled, the thicknesses T1-T3 may be equal to the thicknesses T1'-T3', respectively. However, in some practical embodiments, the thicknesses T1-T3 are different from the thicknesses T1'-T3', respectively. In the present embodiments, the thickness T3/T3' is less than the thickness T2/T2', such that the BARC layer may fill the recess in the work function metal layer in the third area A3 and block the etchant from flowing to the second area A2 when patterning the work function metal layer 198. In some embodiments, the thickness T1/T1' is different from the thickness T2/T2', such that the threshold voltage of the first transistor TR1 is tuned to be higher than or lower than the threshold voltage of the second transistor TR2. For example, the thickness T1/T1' is less than T2/T2', and the thickness T1/T1' is less than the thickness T3/T3'. In some embodiments, the thickness T1/T1' is in a range from 1 nanometers to 30 nanometers, the thickness T2/T2' is in a range from 3 nanometers to 30 nanometers, and the thickness T3/T3' is in a range of 1 nanometers to 30 nanometers.

Since the portions WS1 and WS3 include different layers, the thickness T3/T3' may be different from the thickness T1/T1'. For example, in present embodiments, the thickness T3/T3' is greater than the thickness T1/T1'. However, in some other embodiments, the thickness T3/T3' may be smaller than the thickness T1/T1'.

In accordance with the work function metal structure WS, the filling conductor 200 has portions 210-230 over the portions WS1, WS2, and WS3 respectively. For example, the portions 210-230 are respectively over the crown base structure 118a, the crown base structure 118b, and the inter-device isolation structure 122, such that the bottom surface of the portion 230 of the gate conductor 200 is lower than a bottom surface of the portion 220 of the gate conductor 200. In some embodiments, the portions 210 and 220 are over the intra-device isolation structures 124a and 124b respectively. The portions 210-230 have widths W1, W2, and W3, respectively. In some embodiments, the width W3 is greater than the width W2, so as to prevent the etch penetration. In some embodiments, the width W1 is different from the width W2. For example, the width W1 is greater than the width W2, and the W1 is greater than the width W2. In some embodiments, the width W3 is different from the width W1. For example, in the present embodiments, the width W3 is smaller than the width W1. However, in some other embodiments, the width W3 may be greater than the width W1.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that etchants or other liquid are prevented from flow to the void between the BARC layer and the work function metal layer, so as to prevent the etch penetration. Another advantage is that devices with different threshold voltages may be integrally formed.

According to some embodiments of the present disclosure, a semiconductor device includes a semiconductor substrate, a first semiconductor fin, a second semiconductor fin, an isolation structure, and a gate structure. The first and second semiconductor fins extend upwards from a top surface of the semiconductor substrate. The isolation structure is between the first semiconductor fin and the second semiconductor fin. The gate structure includes a first work function layer, a second work function layer, and a third work function layer. The first work function layer surrounds the first semiconductor fin and the second semiconductor fin. The second work function layer surrounds the first semiconductor fin and is over the first work function layer. The third work function layer surrounds the first semiconductor fin and is over the second work function layer and the isolation structure. The first work function layer is in contact with the second work function layer and the third work function layer.

According to some embodiments of the present disclosure, a semiconductor device includes a semiconductor substrate, a first semiconductor fin, a second semiconductor fin, an isolation structure, and a gate structure. The first and second semiconductor fins extend upwards from a top surface of the semiconductor substrate. The isolation structure is between the first semiconductor fin and the second semiconductor fin. The gate structure includes a first work function layer, a second work function layer, and a third work function layer. The first work function layer surrounds the first semiconductor fin and the second semiconductor fin. The second work function layer surrounds the first semiconductor fin and is over the first work function layer. The third work function layer surrounds the first semiconductor fin and is over the second work function layer and the isolation structure. The second semiconductor fin is free from coverage by the second work function layer and the third work function layer.

According to some embodiments of the present disclosure, a semiconductor device includes a semiconductor substrate, a first semiconductor fin, a second semiconductor fin, an isolation structure, and a gate structure. The first and second semiconductor fins extend upwards from a top surface of the semiconductor substrate. The isolation structure is between the first semiconductor fin and the second semiconductor fin. The gate structure includes a first work function layer, a second work function layer, and a third work function layer. The first work function layer surrounds the first semiconductor fin and the second semiconductor fin. The second work function layer surrounds the first semiconductor fin and is over the first work function layer. The third work function layer surrounds the first semiconductor fin and is over the second work function layer and the isolation structure. The third work function layer extends beyond the end surface of the second work function layer and has an end surface over the isolation structure and the first work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a first semiconductor fin and a second semiconductor fin extending upwards from a top surface of the semiconductor substrate;
an isolation structure between the first semiconductor fin and the second semiconductor fin; and
a gate structure comprising:
a first work function layer surrounding the first semiconductor fin and the second semiconductor fin;
a second work function layer surrounding the first semiconductor fin and over the first work function layer; and
a third work function layer surrounding the first semiconductor fin and over the second work function layer and the isolation structure, wherein the first work function layer is in contact with the second work function layer and the third work function layer, wherein the second semiconductor fin is free from coverage of the second work function layer and the third work function layer.

2. The semiconductor device of claim 1, wherein the gate structure comprising a filling conductor over the first to third work function layers and in contact with the first work function layer.

3. The semiconductor device of claim 2, wherein the second work function layer is spaced apart from the filling conductor by the third work function layer.

4. The semiconductor device of claim 2, wherein the filling conductor is in contact with an end surface of the third work function layer.

5. The semiconductor device of claim 1, wherein the third work function layer extends beyond an end surface of the second work function layer.

6. The semiconductor device of claim 1, wherein the gate structure further comprises a gate dielectric layer, and the first work function layer spaces the second work function layer and the third work function layer from the gate dielectric layer.

7. The semiconductor device of claim 1, wherein the first work function layer is a titanium-containing layer.

8. A semiconductor device, comprising:
a semiconductor substrate;
a first semiconductor fin and a second semiconductor fin extending upwards from a top surface of the semiconductor substrate;
an isolation structure between the first semiconductor fin and the second semiconductor fin; and
a gate structure comprising:
a first work function layer surrounding the first semiconductor fin and the second semiconductor fin;
a second work function layer surrounding the first semiconductor fin and over the first work function layer; and
a third work function layer surrounding the first semiconductor fin and over the second work function layer, wherein the second semiconductor fin is free from coverage by the second work function layer and the third work function layer.

9. The semiconductor device of claim 8, wherein the gate structure comprising a filling conductor over the first to third work function layers.

10. The semiconductor device of claim 9, wherein the filling conductor is in contact with a portion of the first work function layer surrounding the second semiconductor fin.

11. The semiconductor device of claim 9, wherein the filling conductor is spaced apart from the second work function layer.

12. The semiconductor device of claim 8, wherein the third work function layer extends beyond an end surface of the second work function layer.

13. The semiconductor device of claim 8, wherein a combination of the first to third work function layers has a first step sidewall and a second step sidewall over the isolation structure.

14. The semiconductor device of claim 13, wherein the gate structure comprising a filling conductor over the first to third work function layers in contact with the first step sidewall and the second step sidewall.

15. A semiconductor device, comprising:
a semiconductor substrate;
a first semiconductor fin and a second semiconductor fin extending upwards from a top surface of the semiconductor substrate;
an isolation structure between the first semiconductor fin and the second semiconductor fin; and
a gate structure comprising:
a first work function layer surrounding the first semiconductor fin and the second semiconductor fin;
a second work function layer surrounding the first semiconductor fin and over the first work function layer, wherein the second work function layer has an end surface over the isolation structure and the first work function layer; and
a third work function layer surrounding the first semiconductor fin and over the second work function layer, wherein the third work function layer extends beyond the end surface of the second work function layer and has an end surface over the isolation structure and the first work function layer.

16. The semiconductor device of claim 15, wherein the gate structure comprising a filling conductor over the first to third work function layers and in contact with the end surface of the third work function layer.

17. The semiconductor device of claim 16, wherein the filling conductor is in contact with a top surface of the first work function layer.

18. The semiconductor device of claim 16, wherein the filling conductor is in contact with a top surface of the third work function layer.

19. The semiconductor device of claim 15, wherein the third work function layer is in contact with the end surface of the second work function layer.

20. The semiconductor device of claim 15, wherein the end surface of the third work function layer is spaced apart from a portion of the first work function layer surrounding the second semiconductor fin.

* * * * *